US008224636B2

(12) United States Patent
Kundert

(10) Patent No.: US 8,224,636 B2
(45) Date of Patent: Jul. 17, 2012

(54) METHOD AND SYSTEM FOR IMPLEMENTING PARALLEL EXECUTION IN A COMPUTING SYSTEM AND IN A CIRCUIT SIMULATOR

(75) Inventor: Kenneth S. Kundert, Los Altos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 1286 days.

(21) Appl. No.: 10/739,876

(22) Filed: Dec. 17, 2003

(65) Prior Publication Data

US 2004/0261058 A1    Dec. 23, 2004

Related U.S. Application Data

(60) Provisional application No. 60/434,295, filed on Dec. 17, 2002.

(51) Int. Cl.
*G06F 7/60* (2006.01)
*G06F 17/50* (2006.01)
*G06F 9/44* (2006.01)
*G06F 9/455* (2006.01)
*G06F 9/45* (2006.01)
*G06F 15/04* (2006.01)

(52) U.S. Cl. ......... 703/14; 716/103; 716/104; 716/132; 716/139; 717/150; 717/154; 717/160; 717/161; 703/2; 703/13; 703/15; 703/21; 703/22; 703/23

(58) Field of Classification Search .................... 703/14, 703/2, 13, 15, 21, 22, 23; 716/103, 104, 716/132, 139; 717/150, 154, 160, 161
See application file for complete search history.

(56) References Cited

U.S. PATENT DOCUMENTS

| | | | | |
|---|---|---|---|---|
| 5,230,053 | A | * | 7/1993 | Zaiki .............................. 717/150 |
| 5,247,468 | A |   | 9/1993 | Henrichs et al. |
| 5,361,354 | A | * | 11/1994 | Greyzck ........................ 717/160 |
| 5,704,053 | A | * | 12/1997 | Santhanam .................... 717/158 |
| 5,784,593 | A | * | 7/1998 | Tseng et al. .................... 703/15 |
| 5,790,859 | A | * | 8/1998 | Sarkar ........................... 717/130 |
| 5,801,958 | A |   | 9/1998 | Dangelo et al. |
| 5,842,022 | A | * | 11/1998 | Nakahira et al. .............. 717/160 |

(Continued)

FOREIGN PATENT DOCUMENTS

WO      WO 95/32476      11/1995

(Continued)

OTHER PUBLICATIONS

Common Lisp the Language, 2$^{nd}$ Edition 1995.*

(Continued)

*Primary Examiner* — Shambhavi Patel
(74) *Attorney, Agent, or Firm* — Vista IP Law Group, LLP

(57) ABSTRACT

A method and mechanism for implementing a general purpose scripting language that supports parallel execution is described. In one approach, parallel execution is provided in a seamless and high-level approach rather than requiring or expecting a user to have low-level programming expertise with parallel processing languages/functions. Also described is a system and method for performing circuit simulation. The present approach provides methods and systems that create reusable and independent measurements for use with circuit simulators. Also disclosed are parallelizable measurements having looping constructs that can be run without interference between parallel iterations. Reusability is enhanced by having parameterized measurements. Revisions and history of the operating parameters of circuit designs subject to simulation are tracked.

46 Claims, 23 Drawing Sheets

U.S. PATENT DOCUMENTS

| | | | | |
|---|---|---|---|---|
| 5,852,734 | A * | 12/1998 | Komatsu et al. | 717/156 |
| 5,974,248 | A | 10/1999 | Graef | |
| 6,021,266 | A * | 2/2000 | Kay | 716/103 |
| 6,053,949 | A | 4/2000 | Takai et al. | |
| 6,055,627 | A * | 4/2000 | Kyushima et al. | 712/233 |
| 6,070,011 | A * | 5/2000 | Liu et al. | 717/160 |
| 6,074,433 | A * | 6/2000 | Haraguchi et al. | 717/160 |
| 6,077,304 | A | 6/2000 | Kasuya | |
| 6,083,269 | A | 7/2000 | Graef et al. | |
| 6,123,734 | A | 9/2000 | Sato | |
| 6,154,719 | A | 11/2000 | Saitoh et al. | |
| 6,292,765 | B1 | 9/2001 | Ho et al. | |
| 6,295,636 | B1 * | 9/2001 | Dupenloup | 716/103 |
| 6,367,070 | B1 * | 4/2002 | Haghighat et al. | 717/160 |
| 6,438,747 | B1 * | 8/2002 | Schreiber et al. | 717/160 |
| 6,507,947 | B1 * | 1/2003 | Schreiber et al. | 717/160 |
| 6,557,127 | B1 | 4/2003 | Adams et al. | |
| 6,560,572 | B1 | 5/2003 | Balaram et al. | |
| 6,651,246 | B1 * | 11/2003 | Archambault et al. | 717/160 |
| 6,769,100 | B2 | 7/2004 | Acar et al. | |
| 6,817,007 | B2 * | 11/2004 | Burnette et al. | 716/103 |
| 6,820,250 | B2 * | 11/2004 | Muthukumar et al. | 717/116 |
| 6,842,727 | B1 | 1/2005 | Hayashi | |
| 6,871,331 | B1 | 3/2005 | Bloom et al. | |
| 7,079,997 | B1 | 7/2006 | Hsu et al. | |
| 7,086,047 | B1 * | 8/2006 | Edwards et al. | 717/160 |
| 7,120,879 | B2 * | 10/2006 | Gutberlet et al. | 715/853 |
| 7,159,217 | B2 * | 1/2007 | Pulsipher et al. | 718/100 |
| 7,237,229 | B2 * | 6/2007 | Ogawa et al. | 717/125 |
| 7,539,602 | B2 * | 5/2009 | Willis | 703/2 |
| 7,571,301 | B2 * | 8/2009 | Kejariwal et al. | 712/215 |
| 7,631,305 | B2 * | 12/2009 | Rong et al. | 717/161 |
| 2001/0047511 | A1 * | 11/2001 | Itou et al. | 717/6 |
| 2002/0173942 | A1 | 11/2002 | Rajsuman et al. | |
| 2003/0074177 | A1 * | 4/2003 | Bowen | 703/22 |
| 2004/0015915 | A1 * | 1/2004 | Lam et al. | 717/150 |

FOREIGN PATENT DOCUMENTS

WO     WO 01/40941 A3     6/2001

OTHER PUBLICATIONS

Peir et al. "Minimum Distances: A Method for Partitioning Recurrences for Multiprocessors" 1989.*

Weiss et al. "A Study of Scalar Compilation Techniques for Pipelined SuperComputers", ACM 1987.*

Microsoft Computer Dictionary 5$^{th}$ Edition.*

Ernst, Michael. "Serializing Parallel Programs by Removing Redundant Computation", Aug. 1994.*

Shiflet, Angela "Problem Solving in C Including Breadth & Laboratories", 1995.*

Chen et al. "Efficient Approach for Monte Carlo Simulation Experiments and its Applications to Circuit Design Systems" 2001.*

Kennedy et al. "Interactive Parallel Programming Using the ParaScope Editor", IEEE Transactions on Parallel and Disriblited Systems, vol. 2, No. 3, Jul. 1991.*

Lewis, David. "A Compiled-Code Hardware Accelerator for Circuit Simulation" IEEE Transactions on Computer-Aided Design, vol. I I. No. 5. May 1992.*

Lee, Gyngho. "Parallelizing Iterative Loops with Conditional Branching", IEEE Transactions on Parallel and Distributed Systems, vol. 6. No. 2. Feb. 1995.*

Boulet et al. "Loop parallelization algorithms: From parallelism extraction to code generation", Parallel Computing 24__1998. 421-444.*

Hung et al. "Parallel Circuit Simulation using Hiererchical Relaxation", 1990 IEEE.*

Weindhardt et al. "Pipeline Vectorization", IEEE Transactions on Computer-Aided Design of Integrated Circuits and Systems, vol. 20, No. 2, Feb. 2001.*

P. Miller, "Parallel, Distributed Scripting with Python," Center for Applied Scientific Computing, Lawrence Livermore National Laboratory, pp. 1-15.

Ian Foster, et al., "The Nexus Approach to Integrating Multithreading and Communication," Mathematics and Computer Science Division, Argonne National Laboratory, Argonne, IL, Beckman Institute, California Institute of Technology, Pasadena, Ca, pp. 1-22.

Terrene Diaz, et al., "The Argonne Voyager Multimedia Server," Mathematics and Computer Science Division, Argonne National Laboratorr, Argonne, IL 60439.

International Search Report dated Nov. 11, 2005 (PCT/US2003/40589).

Spectrum News, "Using Probe on a Spice File", Summer 2000, pp. 1-5.

Ferscha et al. "Java Based Conservative Distributed Simulation", Proceedings of the 1996 Winter Simulation Conference.

"AvanWaves User Guide", Avent! Corporation, 1997.

* cited by examiner

```
measurement cp1 --- "Measures 1 dB compression point" {
    input inst src=Pin from {port} --- "Input source"
    input inst load=Rout from {port resistor} --- "Output load"
    input real start=-10_dBm --- "Initial input power level"
    input real stop=10_dBm from (start:inf) --- "Final power level"
    input real fund=1GHz --- "Fundamental frequency"
    output point cp --- "1 dB compression point"
    export signal Pout --- "Output power versus input power"

src:type = 'sine
    src:freq = fund
    foreach src:dbm from swp(start=start, stop=stop) {
        run pss(fund=fund)
        real Vfund = V(load)[1]
        Pout=dBm(Vfund^2/(2*load:r)) "W")
    }
    cp=cp (Pout,1)
}
```

Fig. 5

| Edit | | | | History | | | | |
|---|---|---|---|---|---|---|---|---|
| Variable | Variable | Vdd | Select | Parameters: | Most Recent | Select | Most Recent | |
| Corner | Value | 5 V | | Results: | Most Recent | Select | Vdd = 5 V. | |
| Condition | | | | Reference: | Mondays | Select | Corner = Typical | |
| Configs | | | | Save as | | Select | Rl:r = 55 Ohms | |
| Simulator | | | | Compare: | | Select | Reltol=1e-4 | |
| Instance | | | | Delete: | | Select | Npn:warnif=sat | |
| Model | | | | Back annotate: | | Select | Netlist="current.sp" | |
| Results | | | | | | | | Configure |
| Name | Value | | Goal | Deviation | Yield | Bounds | Related Graphs and Tables | |
| Gain | ☑ 14.5 dB | | ☐ < 16 dB<br>> 14 dB | ☐ 1.7 dB | | < 18 dB<br>> 12 dB | ☑ S21 vs Freq | Show |
| Return Loss | | | ☐ > 30 dB | ☐ 7 dB | | > 25 dB | ☑ S11 vs Freq | Show |
| NF | ☑ 4.7 dB | | ☐ < 3 dB | ☐ 0.9 dB | ☐ 92 % | < 5 dB | ☑ NF vs Freq | Show |
| CP1 | | | ☐ > −5 dB | ☐ 1.5 dB | | > −8 dB | ☐ Fund vs Input Pwr | Show |
| IP2 | | | ☐ > 5 dB | ☐ 5.6 dB | | > 0 dB | ☐ 2nd vs Input Pwr | Show |
| IP3 | | | ☐ > 5 dB | ☐ 2.5 dB | | > 0 dB | ☐ 3rd vs Input Pwr | Show |
| Run | | | | | | | | Configure |
| Update Marked<br>Values | Update All<br>Values | | Optimize to Marked<br>Goals | Update Marked<br>Deviations | | Optimize Marked<br>Yields | ☐ Generate<br>Report | |
| User-Defined<br>Groups | Update<br>Small-Signal | | Update<br>Distortion | | | | cadence | |
| Status | | | | | | | | Configure |
| Measurement: Gain (1 of 3) | | Analysis: FreqResp (1 of 1) | | Done in 7m (9:35 am) | | | | |
| Messages | Severity: | All | Select | Phase: | All | Select | Message 1 of 5 | Prev | Next |
| Warning | Cf has an unusually large value of 1F. | | | | | | Show | Hide |

Fig. 8

Trace markers.

A trace marker attached to a scalar.

A trace with a marker.

A deltax marker.

A deltay marker.

A delta marker.

A compression point measurement with a cp marker.

A gain compression point measurement with a cp marker.

A intercept point measurement with a ip marker.

An impedance plot for a RF inductor.
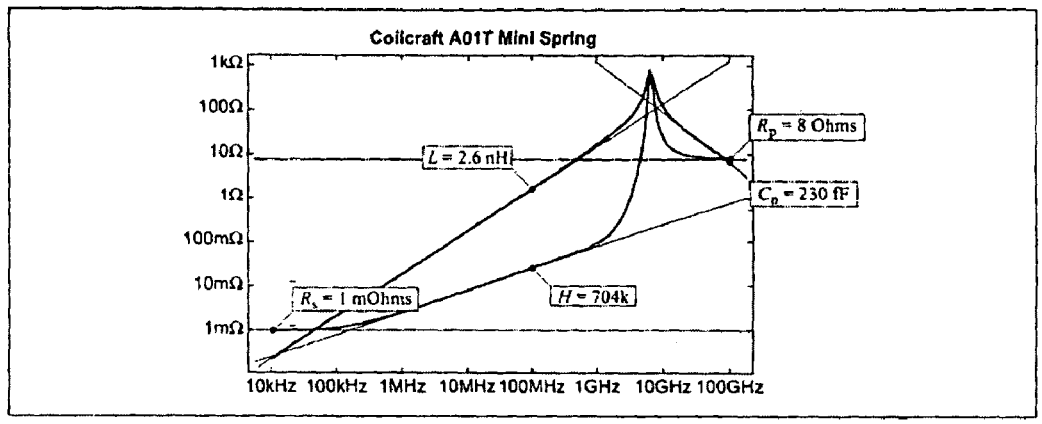
Fig. 26
Noise circles of an amplifier
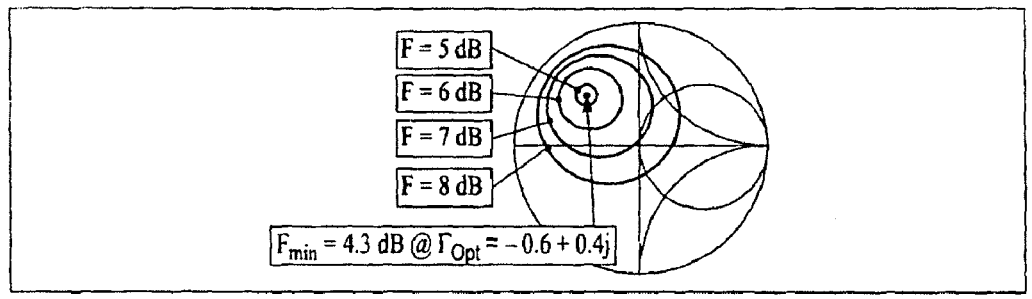
Fig. 27
Available mask types
| above | below | right | left | inside | outside |
|---|---|---|---|---|---|
| not_above | not_below | not_right | not_left | not_inside | not_outside |
Fig. 28

METHOD AND SYSTEM FOR IMPLEMENTING PARALLEL EXECUTION IN A COMPUTING SYSTEM AND IN A CIRCUIT SIMULATOR

CROSS-REFERENCE TO RELATED APPLICATIONS

The present application claims priority to U.S. Provisional Application Ser. No. 60/434,295, filed on Dec. 17, 2002, which is hereby incorporated by reference in its entirety.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent files and records, but otherwise reserves all other copyright rights.

TECHNICAL FIELD

The invention relates to parallel execution in a computing system.

BACKGROUND AND SUMMARY

Circuit simulation is a critical aspect in the modern circuit design process. The design process is a highly interactive process where the designer uses the simulator to explore the circuit. It is important that the iterative exploration process of circuit design be as efficient and as natural as possible. It is during the design phase that the designer interactively runs a simulator to determine the effect of changes from various design parameters and component values on a circuit. Any tedious or repetitive actions required by the environment can distract the designer and therefore can result in a waste of the designer's time.

Simulation scripting languages are heavily used by some designers because they allow tedious repetitive tasks to be automated, thereby speeding up the simulation process. However, despite the appeal of scripting languages, many designers do not use them. One obvious reason for this is that languages must be learned before they can be used. This is a significant investment in time that many designers do not feel is justified. The reason is that scripts, once written, tend to be applicable only in the specific situation they were written for, and while it is possible to make them more generic, it generally requires considerable effort and expertise. Writing and keeping track of the many scripts needed can often result in more overhead than simply running the simulations interactively. Thus, unless a designer is doing exactly the same simulations over and over, as they would when doing library characterization, using simulation scripting languages provides a minimal true benefit.

Since, the design process is an iterative process of trial and error. It is common for designers to follow a promising path for hours, only to determine that it is a dead end. By this time, the designer may have lost track of all the changes made to the circuit and may have difficulty returning the circuit to its last good state.

Embodiments of the present invention provide methods and systems that create reusable and independent measurements for use with circuit simulators. Also disclosed are embodiments of parallelizable measurements having looping constructs that can be run without interference between parallel iterations. Reusability is enhanced by having parameterized measurements. Revisions and history of the operating parameters of circuit designs subject to simulation are tracked. Mechanisms are provided that allow for viewing, measurement or other manipulation of signals at specific locations in a circuit design for simulation, such as parameters that include observation points which are implemented using probes. One approach to executing a measurement is via a controllable and flexible control statement, which in one embodiment is the "run" statement. Improved interfaces for viewing, controlling, and manipulating simulations and simulation results are also provided. Embodiments of measurement aliases are also described herein.

The present disclosure also provides a method and mechanism for implementing a general purpose scripting language that supports parallel execution. In an embodiment, parallel execution is provided in a seamless and high-level approach rather than requiring or expecting a user to have low-level programming expertise with parallel processing languages/functions.

Other and additional objects, features, and advantages of the invention are described in the detailed description, figures, and claims.

BRIEF DESCRIPTION OF THE DRAWINGS

FIG. 5 shows an illustrative example of a measurement according to an embodiment of the invention.

FIG. 8 shows an illustrative example of an interactive datasheet according to an embodiment of the invention.

FIG. 26 illustrates an example of an impedance plot for a RF inductor according to an embodiment of the invention.

FIG. 27 illustrates an example of a circle marker according to an embodiment of the invention.

FIG. 28 illustrates an example table of mask marker attributes according to an embodiment of the invention.

DETAILED DESCRIPTION

The present invention is directed to a method and system for implementing parallel execution, e.g., for circuit simulators. In the specific embodiment(s) illustrated herein, the invention is embodied as a framework for a simulation control language (which may be referred to herein as the "Spectre Measurement Description Language," "SpectreMDL" or "MDL") that can be applied to control circuit simulation products, e.g., the Spectre and Wavescan products available from Cadence Design Systems, Inc. of San Jose, Calif. The Spectre product is a circuit simulator and the Wavescan product is a simulation results display tool. It is noted that the inventive concepts described herein are not limited to the exact language constructs and syntaxes illustrated here, and indeed may be implemented entirely outside of a "language."

Independent Measurement

In one embodiment, the invention implements an independent "measurement" to perform simulations. As described herein, a measurement is an independent parameterized function that performs actions for measuring some aspect of the performance of a circuit. Similar to named procedures in a traditional programming language, a measurement comprises a collection and sequence of language statements, which in the present embodiment implements a set of activities to perform simulation.

Typically, a simulator has a large amount of internal state (the circuit and its parameters, environmental conditions such as temperature, simulator options, etc.) and there can exist a set of functions to manipulate that state and to analyze the circuit. The activities of a measurement can be generically implemented so that they are shared between users and can be encapsulated making them easy to reuse for different circuit designs. In this way, a measurement can be written once and shared with other designers. The measurement can be tailored to a particular circuit design by specifying the appropriate input parameter values, which are the stimulus and operating parameters, e.g. voltage, current, power, temperature, frequency, and period, of the circuit design. For example, a generic bandwidth measurement could be applied to a particular circuit by specifying the name of the input source, the point where the output is to be observed, and the frequency range to be used as parameters to the measurement. This is in contrast to conventional scripting languages for simulation which are normally implemented with very specific scripts that only apply to very specific simulation scenarios.

Figure 1:
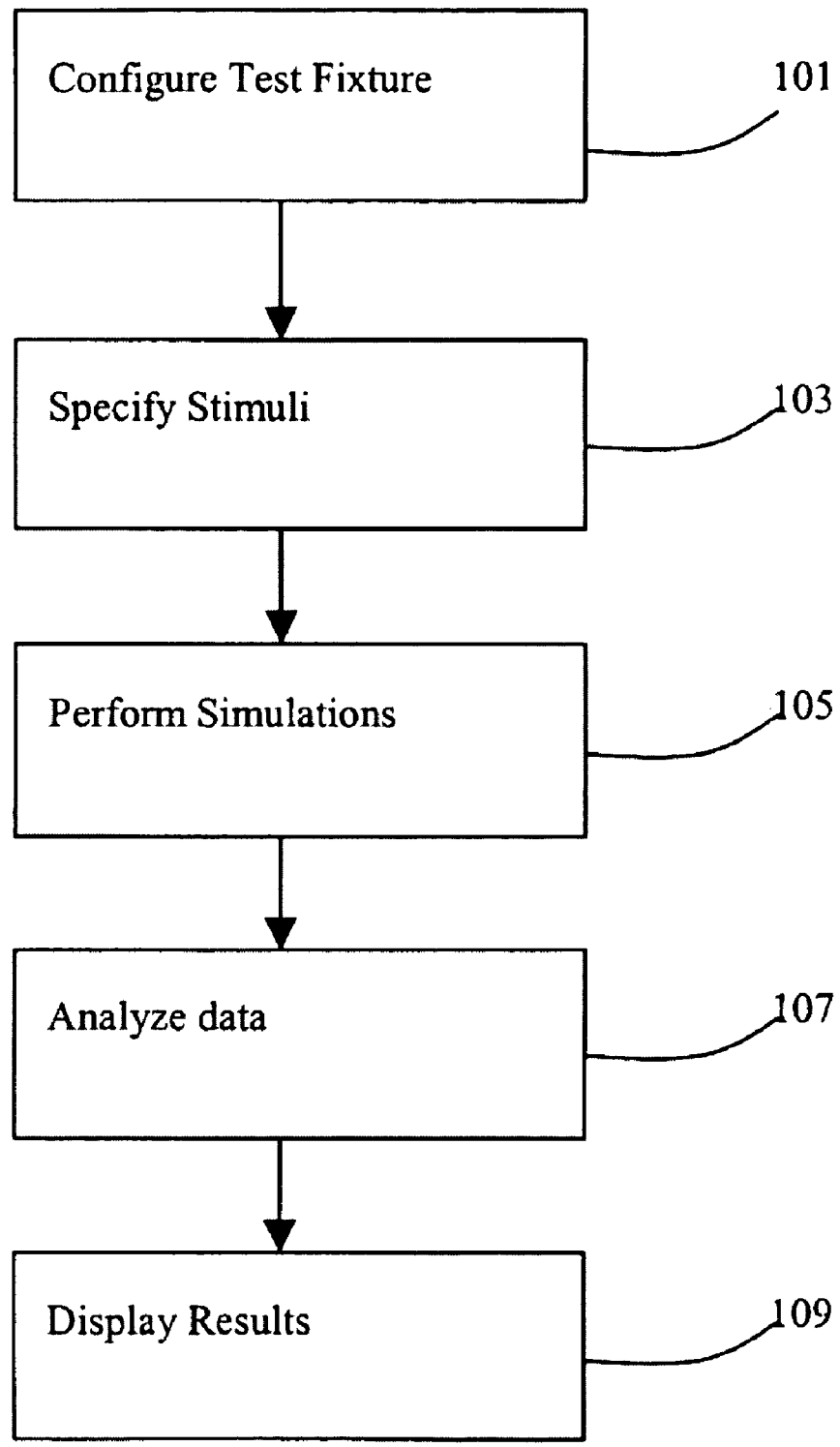
FIG. 1 shows a flowchart of a process implemented by a measurement according to an embodiment of the invention.

FIG. 1 shows a flowchart of actions that may be performed by a measurement in one embodiment of the invention. At 101, the measurement performs actions to configure the test fixture. At 103, the measurement specifies stimuli for the simulation. This action may comprise, for example, specifying parameters for the input data values to be used in the simulation. At 105, the simulation(s) are performed. The resultant data is analyzed at 107. As discussed in more detail below, the data analysis action of 107 may be performed upon the entire output data set after completion of the simulation, or performed on-the-fly for specific data outputs during the simulation actions of 105. At 109, the output results of the simulation are displayed. The measurement is a repeatable function that produces a consistent result assuming that the same parameters are employed with the same circuit design. Measurements can be assembled like building blocks to form more complex measurements and combined to completely characterize a circuit.

In contrast to procedures or functions in traditional programming languages, a measurement in embodiments of the invention can be implemented to be independent from interference from other measurements. This aspect of independence for a measurement is significant because a simulation function can change the state of the simulator, and therefore it can have side effects that interfere with other simulation functions. For example, consider two simulation functions that can be performed, one that measures the bandwidth of a circuit and the other that measures offset versus temperature. The simulator initially starts with the temperature set to 27° C. If the bandwidth simulation function is run first, the bandwidth is measured at 27° C. However, if the offset simulation function is run first, and if the offset simulation function does not return the temperature back to its original value, then the bandwidth will be measured at some other temperature. Thus, this lack of independence between the simulation functions causes interference, thereby making the simulation activities more prone to error, confusing, and difficult to use.

In conventional programming languages, this type of error may occur since a procedure may not be entirely independent from other procedures. In part, this results because of the way global variables are handled by conventional procedures, in which each procedure may potentially make permanent changes to a global variable, with these changes persisting even after the procedure completes it execution. If a circuit parameter is implemented as a global variable, then implementing this type of typical programming language for circuit simulation may allow one procedure to detrimentally interfere with another procedure.

The present embodiment introduces the concept of independent or side-effect-free measurements. During the course of the measurement, every change to the state of the simulator is tracked. At the end of the measurement, every change is reversed. Thus, the simulator and the circuit is returned to its original state at the end of the measurement. This makes the language easier to use by freeing both the implementer and the user of measurements from worrying about side effects.

Figure 2:
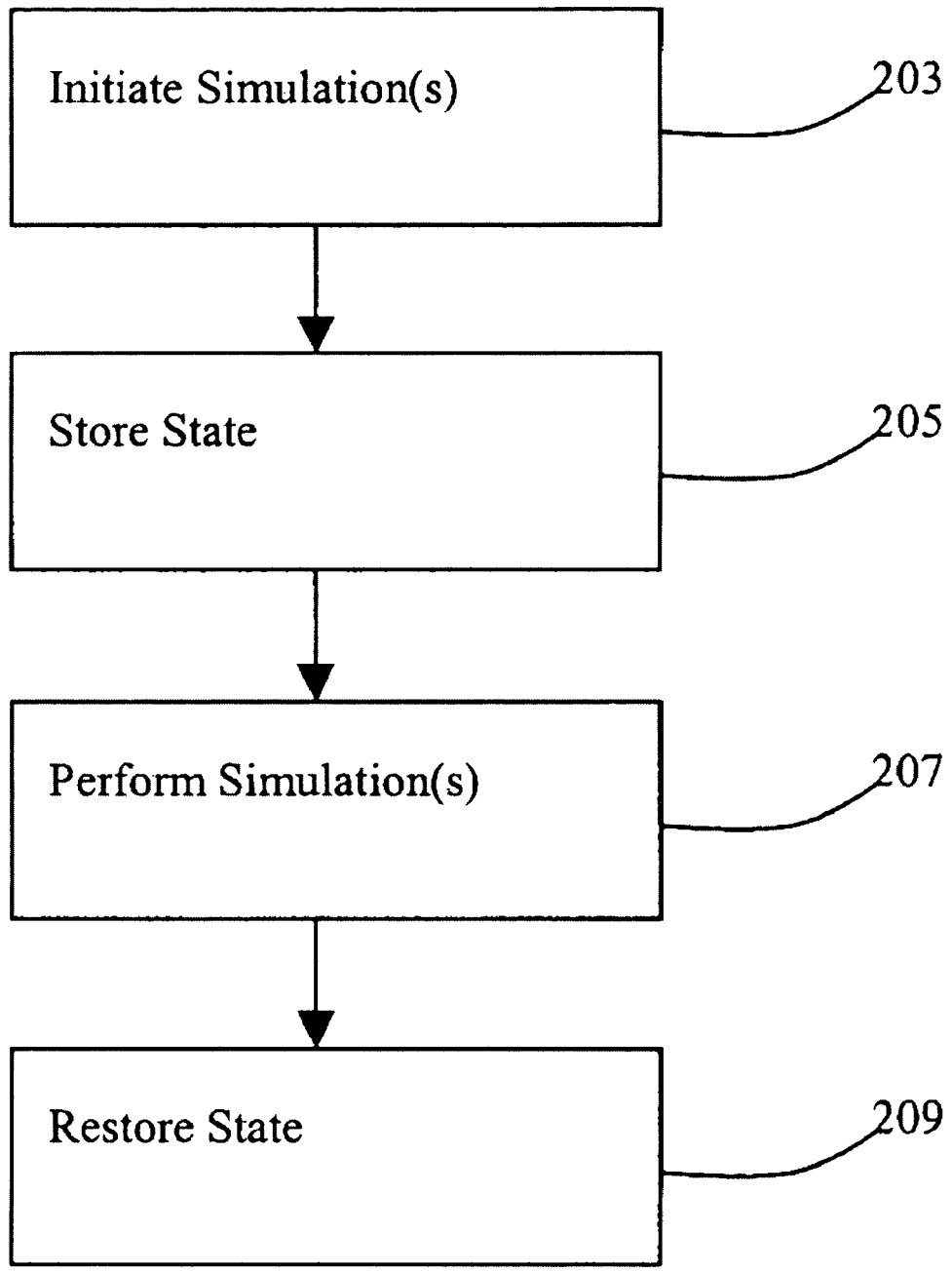
FIG. 2 shows a flowchart of a process performed by a simulator for implementing state-restoration functionality according to an embodiment of the invention.

A process for implementing this aspect of an embodiment of the invention is shown in FIG. 2. At 203, the simulation activity is initiated. This is performed, for example, by calling a measurement. At 205, the state of the simulator and circuit is preserved. This can be accomplished, for example, by logging the state of each data element that is modified or updated during the simulation. Alternatively, this can be accomplished by storing a snapshot of the entire state of the simulator and circuit or by starting up a fresh copy of the simulator. At 207, simulation activities are performed upon the circuit. At 209, the state of the simulator and circuit is restored. This can be accomplished by restoring the state of each changed data value that was stored to the log. Alternatively, the entire state of the simulator and circuit can be restored from the logged snapshot or terminating the simulator.

In the present embodiment, a measurement conceptually comprises a construct in an embodied language having statements that specify stimuli and operating parameters and extract specific output and operating information from the circuit simulator for the circuit design. Generally, the output and operating information can be related to any parameter of circuit operation, e.g. signal characteristics, temperature, frequency, etc.

FIG. 5 illustratively shows an example of a measurement ("Measurement cp1"), which measures 1 dB compression points of a circuit. The first portion of Measurement cp1 establishes and configures parameters for the measurement functionality. In the disclosed embodiment, parameters are declared similarly to variable declarations in many programming languages, except that an input or output qualifiers may be specified. Thus, the parameter declaration may establish the type of each parameter and whether it is being specified by the user on the parameter list, or returned by the function. In addition, default values units, range limits, and descriptions may also be specified. In one approach, the value of an input parameter cannot be changed within the body of a function or measurement. Parameters may be initialized using the value of any previously defined parameter. If a default value is not given for an input parameter, then that parameter will be specified when calling the function or measurement, or the designer can be prompted to input a value.

The foreach loop iteratively performs simulation activities over a range of parameter values for the measurement, and is described in more detail below. As described in more detail below, the "run" command performs the specific simulation activity to which the measurement is directed. Pout is the output of the sweep block.

In order to support reuse of measurements, certain restrictions may be placed on the code contained within measurements to avoid non-portable measurements. The measurement can be implemented such that direct access to the circuit design topology and components from within the measurement are prevented. In particular, direct access to nodes, instances, models, specific circuit parameters, or the like are prevented in one embodiment of the measurement, while accesses are permitted to generic circuit parameters, such as temperature. However, pointers to these objects can be passed in as parameters to the measurement, and so the measurement is given indirect access to the circuit under test. In this way the measurement can be re-used on another circuit by simply changing the values specified for these parameters.

In one embodiment, measurements produce results in the form of datasets. Data saved in export statements inside a measurement are placed in datasets for use outside the measurement. Measurements include both user defined measurements as well as analyses built into the simulator. In one embodiment, a dataset contains a collection of results, generally in the form of scalars, signals, and families of signals. Access to results within a particular dataset could be implemented using identifiers separated by delimiters.

To maintain the independence of measurements, the dataset outputs of measurements should also be independent. In one embodiment, this is implemented by storing the dataset for a measurement in a separate storage location for each measurement. Such storage locations could be, for example, separate or protected locations in a memory cache.

Analyses may create large datasets that contain many signals. For example, AC analysis is likely to create a data set that contains the transfer function from the input source to every node in the circuit. User-defined measurements generally produce smaller datasets. These datasets may contain only the signals that are designated for output and for export. Furthermore, measurements may contain other measurements. In one embodiment, as measurements run, the datasets are arranged hierarchically. Thus, sub measurements deposit their datasets within the dataset of the parent measurement. In this way, all the raw data is available for an in-depth investigation if a high-level result appears anomalous.

A single measurement may generate several datasets. The default dataset, which is named after the measurement in one embodiment, is a pointer to the primary dataset. The primary dataset contains the output and export variables for the measurement. It also contains pointers to the datasets created by sub-measurements. For example, the example compression point measurement of FIG. 5 could produce a dataset cp that points to cp:out that contains the output variable (e.g., cp), the export signal (e.g., Pout), and a pointer to the datasets. A measurement could also create ancillary datasets that contain the conditions of the circuit, the input parameter values for the measurement and the circuit conditions. For the example, these could be named cp:in and cp:conds.

The analyses may product multiple primary datasets. In this case, the default dataset simply refers to one of them. For example, a dc analysis named oppt might produce oppt:dc and oppt:op, the first holding the node voltages and the second holding the detailed operating point dependent device information. In this example, the default dataset oppt might point to oppt.dc. Similarly, a pss analysis named ssResp would produce ssResp:td, ssResp:fd, and ssResp:tran to hold the time-domain, the frequency-domain, and the transient responses, and the default dataset ssResp would point to ssResp.fd. A mixed-signal transient simulation could produce two datasets, one for signals from the continuous-time kernel and one for the signals from the signals from the discrete-time kernel.

The datasets could be mutually overlaying. As an example, consider a signal x that is only in the continuous-time dataset, a signal y that is only in the discrete-time dataset, and a signal z that is in both. If the user makes the continuous-time dataset the active one, and then plots x, y, and z, then x and z from the continuous-time dataset and y from the discrete-time dataset are displayed. In this case, the continuous-time dataset overlays the discrete-time dataset. The signals from both are available, but if a signal with the same name is in both dataset, the signal from the active dataset is used. Similarly, if the user makes the discrete-time dataset the active one, and again plots x, y, and z, then y and z from the discrete-time dataset and x from the continuous time dataset are displayed.

If nodesets, forces, or initial conditions are imposed on an analysis, then in one embodiment, it would also create datasets that contain these values, e.g., which are denoted with the suffixes :nodeset, :force, and :ic.

With measurement aliases (described below), the datasets of the sub measurement will be named after the alias if doing so would not create a conflict with a datasets produced by the alias itself. In this case, the dataset produced by the alias would overlay the one with the same suffix produced by the sub measurement, and the dataset produced by the sub measurement would retain its hierarchical name. For example, consider if alias mycp is created for the cp measurement, and assume the alias includes additional outputs or exports. In this example, the alias would produce a dataset mycp:out that contains the outputs and exports from the alias, and overlays the dataset mycp.cp:out. Thus, listing the signals in mycp:out show both the outputs and exports of mycp and cp, but listing the signals in mycp.cp:out will only show the outputs and exports of cp. If mycp:out and cp:out both contain a signal of the same name, the one from mycp:out is used if it is the active dataset, and the one from mycp.cp:out is used if it is the active dataset. However, now consider creating an alias mypss for the built-in pss analysis. The pss analysis does not produce a :out dataset so there is no conflict between the datasets produced by the alias and the analysis. In this case, the mypss:out is created by the alias to hold its outputs and exports, and mypss:td, mypss.fd, and mypss:tran are produced by the analysis.

A possible exception for the conflicting dataset name rule for measurement aliases applies when an aliased measurement is an alias of itself. In this case the primary dataset of the alias replaces the primary dataset of the sub measurement. If a user defines an alias cp for the cp measurement, a cp:out dataset is generated for the alias, but the dataset from the sub measurement, cp.cp:out, is not created.

Besides the datasets run at the top-level, in one embodiment, there is a hierarchical dataset that can be automatically created, e.g., called prev. When measurements are rerun, the results of the previous run are placed in prev before the new results are generated. Thus, one can always compare against the previous results. The user may create their own datasets by copying existing datasets. Thus, a single dataset may exist in several different places.

Deleting a dataset causes the link to that dataset to be removed. When there are no more links to a dataset, the dataset is permanently deleted. Since a parent dataset contains links to its children, deleting a parent will cause the children to be deleted if there is no other links to the children.

Parallelizable Iterative Block

In many cases, running a simulation is a comparatively expensive activity. Total elapsed time will be reduced if the various iterations of a simulation can be run in parallel. This can be accomplished if there are no dependencies between the simulations. The independent measurements previously described allow this, but increased parallelism can be achieved if traditional looping constructs, which are inherently serial, can be avoided. The present embodiment of the invention provides an approach for implementing the looping constructs so that the iterations can be run in parallel without interference. The present approach can be taken to implement parallel execution for any language, and may be used to implement a general purpose scripting language that supports parallel execution.

In one embodiment, parallel execution is enabled by first identifying a list of tasks to be performed. A set of dependencies or task orderings is specified for the tasks. Alternately, such dependencies or orderings are inferred or derived. Next, each task is executed in a manner that is independent of other parallel tasks. This independence applies both to the input as well as the output of the executed tasks. In other words, the input data values (e.g., a global variable) to the task should not be dependent upon another parallel task. Similarly, the output of the task should be independent of other parallel tasks. In one approach, the method and mechanism described above to implement a measurement can be used to execute tasks in a manner that is independent from other tasks.

In one embodiment, an iterative looping construct is employed that captures all variables that are declared outside the loop and assigned within the loop. Access to an index for the loop is removed. Certain variables that are considered vectors outside the loop are considered scalars inside the loop. In effect, each parallel iteration of the loop runs in its own environment, free from interference with other parallel iterations. Therefore, each parallel iteration is independent of other parallel iterations.

Figure 11:
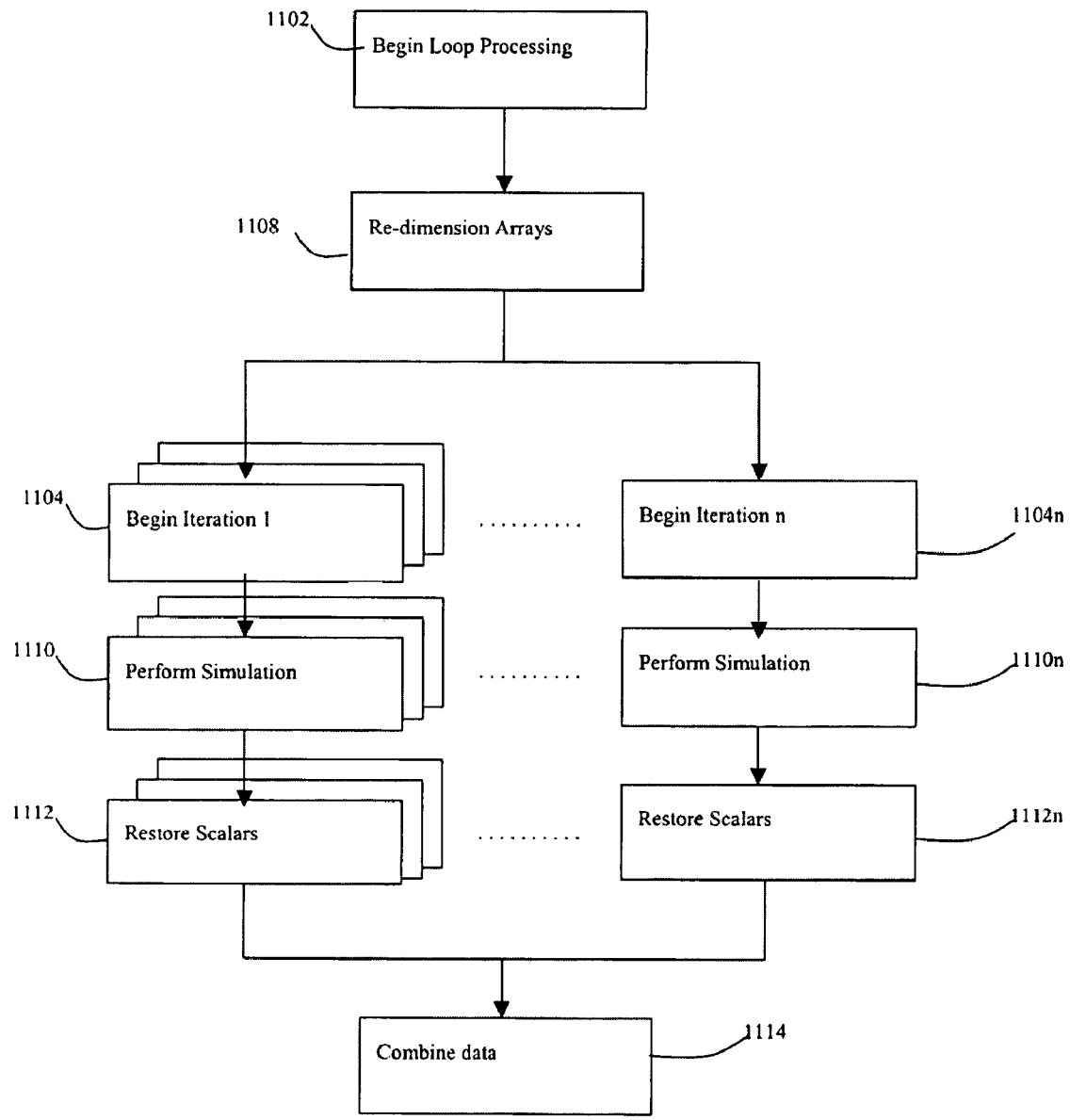
FIG. 11 shows a flowchart of a method for parallel iterative processing according to an embodiment of the invention.

FIG. 11 shows a flowchart of a method for parallel iterative processing according to an embodiment of the invention. At 1102, the loop processing begins. Each parallel iteration begins processing at 1104 through 1104$n$. For each iteration, actions occur to conceptually create a independent processing environment for the iteration, as explained in more detail below. Effectively, if there are N number of iterates, there can be N number of environments that are created to process these iterates. Vectors that are captured by the loop are resized so that they contain the same number of elements as there are iterates in the loop. Each element corresponds to an iterate. In this embodiment, an iterate does not access any element in the vector except the one that to which it corresponds. Arrays that are captured by the loop appear to have one lower dimension within the loop than outside the loop (1108). That dimension is the one that is resized to have the same number of elements as iterates in the loop. Thus, a one-dimensional array (e.g., vector) captured by the loop appears to be a scalar inside the loop.

At 1110, each parallel iterate performs the simulation activity. Before exiting the loop, scalar values are restored (1112). Scalars that are captured by the loop are reset to the value they had when the loop was entered on every iteration. This is true both for scalar variables from with the simulation control language, as well as for circuit parameters and simulator options. They are also returned to their initial value upon exit from the loop. Scalars that are captured by an incremental assignment operator (e.g., +=, −=,*=, /=, etc.) are not returned to their initial value upon exiting the loop. Rather, their final value is the one that results if all of the incremental operations were performed upon exit from the loop. One embodiment of the invention disallows modification of scalars declared outside a loop except for incremental assignment operations. At the end of the parallel iterations, the results can be combined back together (1114). Of course, each iteration in the loop can also be processed serially. Since each iterate can be processed independently from other iterates, a combination of serial and parallel processing can be used to process the iterates in the loop.

In addition to a specific circuit simulation language, the presently described embodiment can also be used to implement a general purpose scripting language that supports parallel execution. In an embodiment, parallel execution is provided in a seamless and high-level manner rather than requiring or expecting a user to have low-level programming expertise with parallel processing languages/functions. This is a very natural thing for scripting languages to want to do because they are relatively lightweight processes that control heavy weight processes. For example, this is the concept behind an operating system shell, e.g., a unix-based shell. In a present embodiment, a lightweight serial control process controls one or more parallel heavyweight processes used to perform specific tasks. Since the users are writing assuming a serial process model, the scripts are relatively easy to write.

However, a basic task model is provided that is restricted to enforce independence between the tasks, which guarantees that they can be run in parallel without interference.

It is not preferred to rely upon programs that count on running through tasks in order. So instead, the present approach makes it easy to build unordered lists and then these are used to control the execution of tasks. There are two important aspects of this approach. First, there is a body of global data (e.g., for a circuit simulator case it could be in the design and in the simulator). This global data may be modified by conditions, which are described in more detail below. To ensure independence of the tasks, the tasks do not or are not allowed to modify this global data. Rather, they are given access to local copies and may modify those. To make this easy and natural for the task, each task runs in a "protected" environment, in which they are free to make changes to what appears to be the global data, but none of the other tasks can see those changes. Second, each task gets a protected space in which to place its results. In addition, each task can call further tasks, and each which is treated in the same way (gets a protected environment and space for results). In the end, the spaces are arranged in a hierarchical manner to allow easy access by the user.

The conventional approaches to implementing parallel or distributed computing all exists at the language level that is targeted at the sophisticated user, i.e., at a very low level that requires considerable expertise to efficiently utilize or operate. Examples includes the Nexus, MPI (Message Passing Interface), and LSF (Load Sharing Facility) approaches. These are all based on the low level concepts of fork & join, explicit synchronization, message passing, etc. These are available in programming languages such as Fortran, C, C++, and Java. A few attempts have been made to bring distributed processing to scripting languages, notably pyMPI and nPer1, but these approaches have basically presented the low-level interfaces that exist in programming languages to these scripting languages. None are targeted at novices. The present approach is the first that completely shields users from the complexities of distributed processing. Under the present approach, a user can essentially identify a list of tasks to operate at a high level and the present mechanisms will run them in parallel by assuring in advance that they will all be independent.

Described now are specific examples of mechanisms that can be utilized to allow the user to specify that tasks should be run in parallel. One example mechanism that can be used to specify that tasks are run in parallel is the "run" command. The run command is a mechanism to execute a measurement or function, and is described in more detail in a subsequent section of this document. The following is an example of a run statement that is used to specify the execution of parallel tasks:

run inl, dnl, sfdr, foreach corner

The "foreach" symbol identifies a looping construct and corner represents an unordered list of conditions, both of which are described in more detail below, Essentially, this example statement indicates that three tasks, named inl, dnl, and sfdr, should be run in parallel.

Furthermore, each task should be run for every corner, and each of those can run in parallel. If there are 100 corners, then this represents 300 independent tasks that can all be run in parallel. This example suggests that there are two ways in which to specify parallel execution in a run statement, to specify multiple tasks and to specify a list of conditions over which the tasks should be applied. To support this, functions can be provided that make it easy to build useful types of lists. Functions such as swp that returns a list of real numbers that cover a particular interval, as well as functions that search through the design and build lists of design objects.

The following are illustrative examples of such functions:

run nf, cp, foreach VDD from {1.8, 2.5, 3.2}

In this example, the nf and cp measurements are run while the design variable VDD is stepped through three values, 1.8, 2.5, and 3.2. In this case it is assumed that VDD is used to control the power supply voltage for the design.

run nf, cp, foreach temp from swp(start=−25, stop=75, step=1)

In this example, the nf and cp measurements are run while the design variable temp is linearly stepped from −25 to 75 in increments of 1. In this case it is assumed that temp is used to control the ambient temperature of the design.

Simulations can be run either in the foreground or in the background. When run in the foreground, the simulation controller waits until the simulations are finished before processing any new input. In addition, the user is kept abreast on the progress of the simulations. This is generally preferred when running short simulations or when running batch simulations.

When running simulations in the background, the controller continues to process command input but provides only limited access to the running simulations and no running summary of the simulator progress. By default, the run command runs simulations in the foreground. To run simulations in the background, additional control mechanisms are employed, e.g., an ampersand (&) is added as the last character on the run command. For example, run acpr & would run the acpr measurement in the background. Thus, in one approach, the controller will return a prompt before the acpr simulation completes. At this point the default dataset is the one being produced by acpr, which is not yet complete. Displaying signals from this dataset will result in partial results being displayed. Further, these results will be automatically updated on a regular basis until the simulation completes, at which point the final results are displayed. All of this activity also occurs in the background.

With measurements running in the background, it could happen that a request is made to run a subsequent measurement that would overwrite a dataset currently being generated by a background measurement. In this case, and error will be issued and the second run command aborted.

If the measurement returns results to a local variable, the value of the variable will be 'null until the measurement completes. Upon completion of the background simulations, a message is printed and the final results are available.

In one embodiment, the current thread of control can be placed in a "wait" state in which further command execution waits on the results of a backgrounded simulation is resumed as soon as the results are available and complete. This approach could take one or more arguments that may be the names of either measurements, datasets, or local variables whose value depends on a measurement. If a name is given that could represent more than one valid object, such as might occur if a variable, dataset, and/or measurement share the same name, then the command will first assume the name represents a variable, and if that is not possible it will assume it is a dataset. The wait approach causes the controller to go to sleep until all of its arguments are available and complete. This might actually occur before the run command itself completes.

As noted above, the present embodiment provides the concept of a foreach loop, which is similar to a for loop in C except that every iteration can safely be evaluated simultaneously. Consider the example Measurement cp1, shown in FIG. 5, which includes the following foreach loop:

```
export signal Pout
foreach src:dbm from swp(start=start, stop=stop) {
    run pss(fund=fund)
    real Vfund = V(load)[1]
    Pout=dBm(Vfund^2/(2*load:r)) "W")
}
```

This foreach statement causes the real-valued parameter src: dbm to be swept over the range of values between start and stop. Notice that there is no index variable defined, as there would be in a traditional iterative block. The lack of an index both simplifies the block and prevents one iterate from accessing the results of another.

The output of the foreach block can be in the form of an array of data over the range of the loop variable. In the example, Pout is the output of the sweep block. It is declared to be a signal, in which "signal" is a vector data type. Notice that within the block Pout appears to be a scalar and outside it appears to be an array. This happens whenever a variable that is declared outside a sweep block is assigned a value inside a sweep block. Within the block, only the value associated with the current iterate is available. Outside the block, all values are available, as is the value of the sweep variable. In this way, each iterate of the sweep is guaranteed to be independent and so can be evaluated in parallel. In one embodiment, a datatype is employed for a "point" that comprises two values—an x value and a y value—with a signal being a vector of points. The foreach loop automatically places the loop index as the x values.

In one approach of the iterative looping construct, on each iteration, the value of the loop variable for that iterate is attached to the element associated with that iterate for each vector captured by the loop.

In addition, the iterate index and the total iteration count can be attached to the loop variable as attributes. In this way, identification can be made of the index within the environment for each iterate, but to exclude use of the index to access other iterates.

The generated datasets created within the loop can be knitted into a hierarchical family of datasets. Each dataset has its own collection of properties, e.g., having a different value as a function of time. In effect, the dataset of waveforms or output results are hierarchically combined together to add dimensions to the datasets.

This form of an iterative looping construct allows iteration over corner sets (corner sets in the embodied language are described in more detail below).

In one embodiment, Foreach loops have three basic forms. The first is

```
foreach iterate from list {
    statement_list
}
```

For each entry in the list, the iterate is set to the element value and the statements in the statement list are evaluated. The iterate is a valid identifier. Within the loop it is treated as a constant and its value once the loop terminates its value is return to the one it had before it was captured by the loop. Any changes made to other variables or circuit parameters are also reversed upon completion of the loop. The list may either be a vector literal, a vector variable, or a vector valued function. For example,

```
foreach VDD from {3.0, 4.0, 5.0} {
    run tran(stop=100ns)
}
``` steps the design parameter VDD through the members of a vector literal. If VDD had the value of 3.2 before the loop, then within the loop it would take the values of 3, 4, and 5, but once the loop terminated its value would be returned to 3.2. This example could also be written as

```
real supplies[ ] = {3.0, 4.0, 5.0}
foreach VDD from supplies {
    run tran(stop=100ns)
}
```

It could also be written as

```
foreach VDD from swp(start=3, stop=5, lin=3) {
    run tran(stop=100ns)
}
```

"Sweep" refers to a function that generates a list. In one embodiment, it supports sweep parameters such as start, stop, center, span, lin, log, step, dec, values, and can be used to create linear or logarithmic sweep ranges. In this example, a power sweep is performed.

```
signal Pout
foreach src:dbm from swp(start=start, stop=stop, log=pts) {
    run pss( fund=fund )
    real Vfund = V(load)[1]
    Pout=dBm(Vfund2/(2load:r) "W")
}
```

In an embodiment, when an iterate is explicitly specified in a foreach loop, two attributes are attached to the iterate, index and count. They are both integers. The first contains index for the iterate. In other words, iterate=list[index]. The second is the number of elements in the list, or one greater than the maximum index. In this example, an array of sources is set up to generate a range of frequencies and powers.

```
inst src
foreach src from ... {
    int index = src::index
    src:type = 'sine
    src:ampl = dBm2i( startpwr + index*deltaP, Rsrc:r )
    src:freq = startfreq + index * deltaF
    src:sinephase = uniform(−360,0)
    ...
}
```

In this example the index of the iterate is attached to the loop variable src and is accessible using src::index.

The following is a second form of the foreach loop:

```
foreach list {
    statement_list
}
```

This form is like the first except there is no loop variable.

The third form of the foreach loop is as follows:

```
foreach condition_list {
  statement_list
}
```

In this form, the list is constrained to be a collection of one or more condition sets. A condition set could be a group where every member of the group is a design quantity or it could be a configuration set. A condition list is a collection of similar condition sets, and could be in the form of a group vector, a corner set, or a configuration set list. The statement list is run for each set of conditions in the condition list. For example,

```
foreach {fast, typ, slow} {
  run tran(stop=100ns)
}
``` would run the transient analysis on each corner as listed individually, and

```
foreach process_corners {
  run tran(stop=100ns)
}
``` would run the transient analysis on each corner as listed collectively in "process_corners".

If a run statement is contained in the statement list in a foreach loop, the resulting dataset is organized in the form of a family of data. When there is an iterate, the value of the iterate becomes an abscissa. Otherwise the abscissa is the name of the condition set. If the condition sets are unnamed, such as when the condition sets are given in the form of a group vector, then there is no abscissa. Since order of execution of the foreach iterates may be arbitrary and unknowable in one embodiment, actions such as printing, writing, reading, etc. are not allowed within this embodiment of the loop. Also, the run command may be silent within an embodiment of the foreach loop, e.g., it does not print the measurement results, etc.

Any object that is defined outside the loop and assigned a value inside the loop is "captured" by the loop. This includes both local variables and circuit variables. When captured, the size of the object is made to conform to the length of the loop. Thus, if the loop is iterating through a list of N elements, then the object is made to have N elements, unless it is a scalar, which are described later. Each element in the object is uniquely associated with an iteration. Within the loop, the name of the captured object is used to refer to the element of the object associated with the iteration, and not the whole object. This approach to looping prevents access to other iterations from a particular iteration. This makes the loop completely parallelizable.

If the variable captured by the loop is defined as having an abscissa, then the value of the iterate is assigned to the abscissa. Scalars captured by the loop take their initial or external value on every iteration, and are returned to their initial or external value once the loop terminates.

A more traditional approach for the loop would increment the value of x on ever iteration. That is not the behavior of the foreach loop in one embodiment because it is a parallelizable loop, meaning that every iteration could be run simultaneously. Thus, it is not possible for one iteration to use the result of another.

Scalars that are captured by an incremental assignment operator (+=, −=, =, /=, etc.) are not returned to their initial value upon exiting the loop. Rather, their value is the one that results if all of the incremental operations were performed upon exit.

Search loops also have the basic forms, the first being:

```
search iterate from list {
  statement_list
} until (condition)
```

This finds a first member of the list that results in the condition being true. This member is referred to as the target value of the iterate. In the case that the list is given as a vector of values, the search begins at the first element of the list and continues towards the end of the list until it finds the first member that results in the condition being true. An alternative form searches to find the last member that is true.

```
search iterate from list {
  statement_list
} while (condition)
```

When the search completes, the iterate retains the target value (the value that resulted in the condition being satisfied). In addition any results produced by the loops in the form of datasets of local variable assignments are those associated with the target iteration. Thus, any variables assigned in the loop or datasets created within the loop will be those that came from the first successful iteration. None of the results from the any other iterations are available.

The list may be replaced by a one of a set of search functions that perform more sophisticated searches. For instance, an example search function that could be used is the binary search function. The binary search function is used to search for the first member of a range of values that satisfies a logical condition. It is assumed that the condition is not satisfied at the beginning of the range (start) and is satisfied at the end (stop).

The second form of the search loop is

```
search condition_list {
  statement_list
} until (condition)
```

In this form, the list is constrained to be a collection of one or more condition sets. The first condition set that results in the condition being satisfied is found.

Another loop commonly provided in a circuit simulator is the Monte Carlo analysis. In this analysis, certain values in the design are designated to be random variables. Then a large number of simulations are performed that are essentially identical except the values of the random variables are modified slightly on each run. This is done as a way of modeling the natural variation that occurs in physically manufactured circuits. Monte Carlo analysis is supported with the addition of the concepts introduced above for sweep analyses. Consider the following Monte Carlo analysis:

```
montecarlo (variations='process, trials=200, moments='yes, name='mc') {
    bw = Bandwidth(start=1MHz, stop=100MHz,sig=V(out))
    sr = SlewRate(stop=20ns,sig=V(out))
    export bw sr
}
view histogram(bw)
view histogram(sr)
```

The variables bw and sr appear to be scalar variables inside the montecarlo analysis, and arrays outside. This allows all trials to be run in parallel. The index for these arrays is an integer that ranges from 0 to 200. Index 0 represents the nominal case. The function histogram returns the frequency of occurrence versus deviation from the nominal (if the nominal was requested, otherwise use the mean). The moments parameter indicates that the statistical moments for all export variables should be computed and reported. Initially the mean and standard-deviation would be generated, though this might eventually be expanded to include cross correlations.

The Monte Carlo analysis generates a dataset that takes the name given in the argument list. If no name is given, montecarlo is used. This dataset contains the values of the random variable and the datasets generated on each trial. Thus it is possible to plot the outputs versus the values of the random variables in the form of a scatter plot.

Tracking and Manipulating Simulator History

A circuit designer may follow various paths of design decisions during the design process. Designers often get acceptable results and then try to improve on them. If they fail, they discard the string of design changes and revert to the circuit that gave them the acceptable results. In other words, they will follow a particular trail until they get what they want or determine that it is not leading them where they want to go, at which point they abandon it for some trail they passed up earlier. Eventually they may decide that some earlier point was, in fact, the best or acceptable one and come back to it. Or, they may find something along the way of value, but later forget where or when they got it. With current products, designers must remember every change and attempt to manually back them out—this approach is fraught with dangers, since a designer may not be able to remember or to recreate an earlier version of the design.

A system and method is described that is capable of tracking changes made to the state of the simulator, which includes in one embodiment changes to the circuit and to simulator options. Changes can be tracked by maintaining a list or history of changes to the simulator. "Conditions" can be used for delineating between a first and second state in the simulator (as described in more detail below, a condition can be considered changes to the base circuit).

Figure 3:
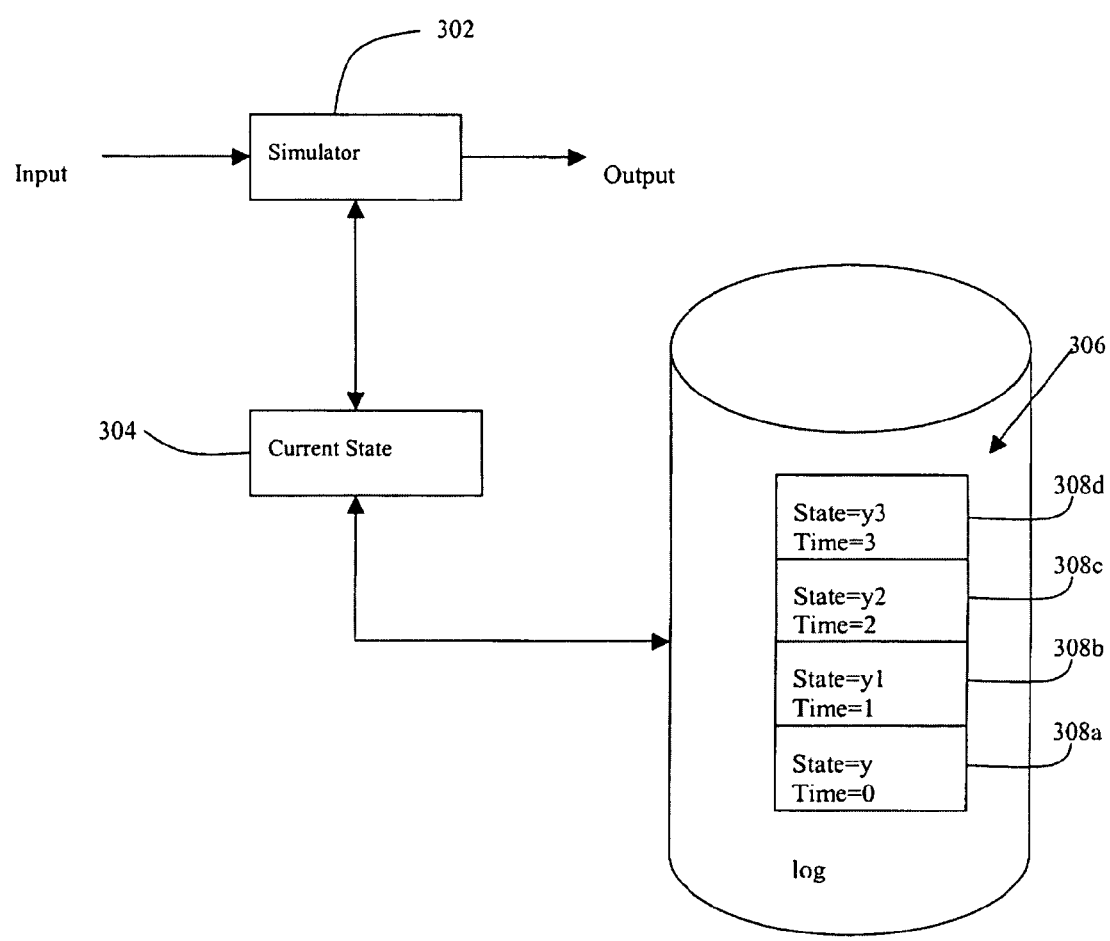
FIG. 3 shows an architecture for logging a history of states in a simulator according to an embodiment of the invention.

FIG. 3 shows an architecture for tracking changes according to one embodiment of the invention. A simulator block 302 is shown that interacts with the current state 304 of the simulator. Current state 304 may comprise, for example, a portion of memory containing the current state of the simulator, circuit, and simulator options. A log 306 is maintained to track a history of states for the simulator. As each change occurs to the state of the simulator, a new entry can be stored in the log 306 to store the corresponding change in state of the simulator. In one embodiment, each change or associated set of changes to the state of the simulator automatically caused the simulator state to be saved as an entry in the log 306. Alternatively, the act of creating an entry to store the state of the simulator can be manually performed by the designer during appropriate stages in the design process.

In the example shown in FIG. 3, the state of the simulator has undergone four changes in state. At time=0, the simulator had a state value equal to the value y, with an entry 308a in the log 306 representing the history entry for this state. At time=1, the simulator had a state value equal to the value y1, with an entry 308b in the log 306 representing the history entry for this state. Similarly, at times t=2 and t=3, the simulator had state values of y2 and y3, which are stored in entries 308c and 308d, respectively. Various approaches may be taken to initiate new log entries or to separate the entries. In one embodiment, each change in the history log is delineated by a new condition. Alternatively, the logged states can be made and/or indexed on a time-based approach. In yet another approach, various milestone or selected savepoints may be used to delineate between log entries.

Figure 4:
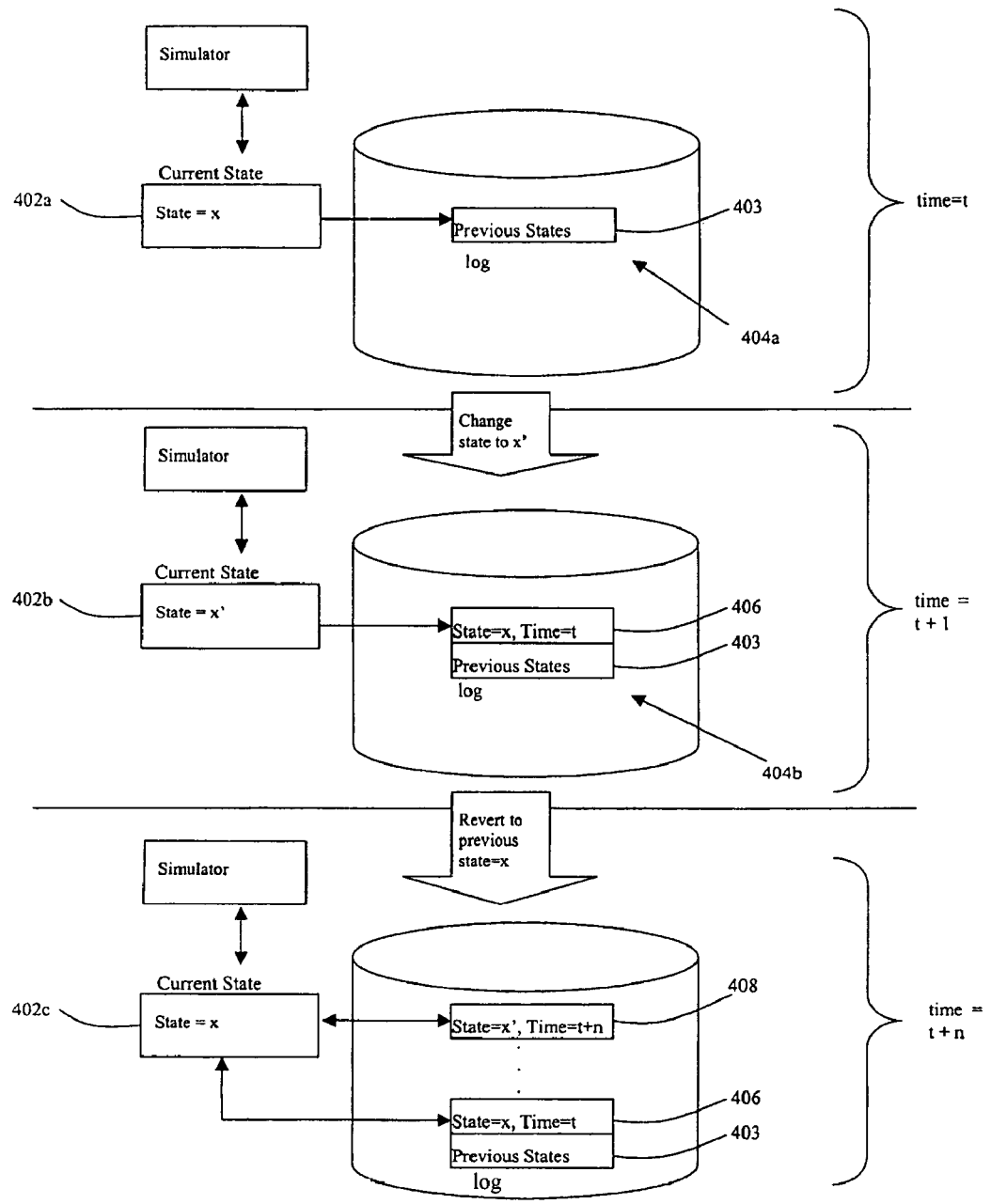
FIG. 4 illustrates a process for implementing state-restoration functionality according to an embodiment of the invention.

FIG. 4 illustrates the process of reverting to a saved version of the simulator or circuit. During an initial time period t, the current state 402a of the simulator has a value x. The history log 404a at time=t includes entries for the previous states of the simulator, if any.

At a later time t+1, the updated current state 402b of the simulator changes to x'. The previous state of the simulator, from just prior to the change in state from x to x', is stored as an entry 406 in the updated history log 404b. Notice that the previous entry 403 is still maintained in the history log. As each new change is made to the circuit or simulator, a corresponding entry is added to the list of entries in the history log. In this manner, an entire chain of entries can be maintained for saving the states of the various paths of design decisions that a designer may follow during the design process.

At a later time=t+n, it may be decided to revert the simulator back to the state of the circuit as of time=t. This reversion is accomplished by restoring the current state 402c of the circuit or simulator back to the recorded state as of time=t, e.g., by restoring the saved state values in history log entry 406 that was saved for time=t. In one embodiment, the entire state of the simulator/circuit is stored in an entry in the history log. In this approach, the reversion occurs by copying the parameter values stored in the appropriate history log entry back into the current state of the simulator. In an alternate embodiment, only changed values in the state are recorded in a history log entry. Thus, if a particular condition changes only parameter x, then only the previous value of parameter x is saved in the corresponding history log entry. The unchanged portions of the simulator state are not recorded in the history log entry. In this approach, to restore a prior version of the simulator, the entire chain and sequence of history log entries leading to the desired state would be restored, to ensure that every change encountered along the way is undone.

Differences between any two versions of the circuit can be displayed, by comparing the saved states of the two version from the history log. Thus, the current circuit can be compared against any previous between prior version of that circuit by identifying and analyzing the saved state of the prior version against the current state of the circuit.

A simulation controller can be used to that keeps track of all changes made to the circuit and the simulator for the purpose of displaying or reversing the changes. In one embodiment, the simulation controller comprises a software module that maintains the contents of the history log.

The simulation controller performs the act of attaching the list of changes in place when a result is generated. When displaying two results, the change lists can be used to determine and display the differences in the circuit between the two results. In addition, simulation controller can reverse one or more changes saved in the change list to revert the circuit back to a previous version. The change list can be used to update the original representation of the circuit, whether in a netlist or taken from a design database.

The present features will significantly improve the efficiency of designers by allowing them to quickly explore the design space by reducing the number of tedious manual operations they must perform and by eliminating the time spent trying to rediscover how a particular desirable result was achieved.

Links to GUI

Once a measurement is created, an interface can be automatically created to allow users to quickly specify parameters for the measurement. To be suitable for novice users, information is made available in a graphical user interface (GUI) form that describes the input parameters and guides the choices for selecting values for the input parameters for the given function. For example, the type of the parameter, any limits on the value of the parameter, and a description of the parameter can be used to generate the form.

Figure 6A:
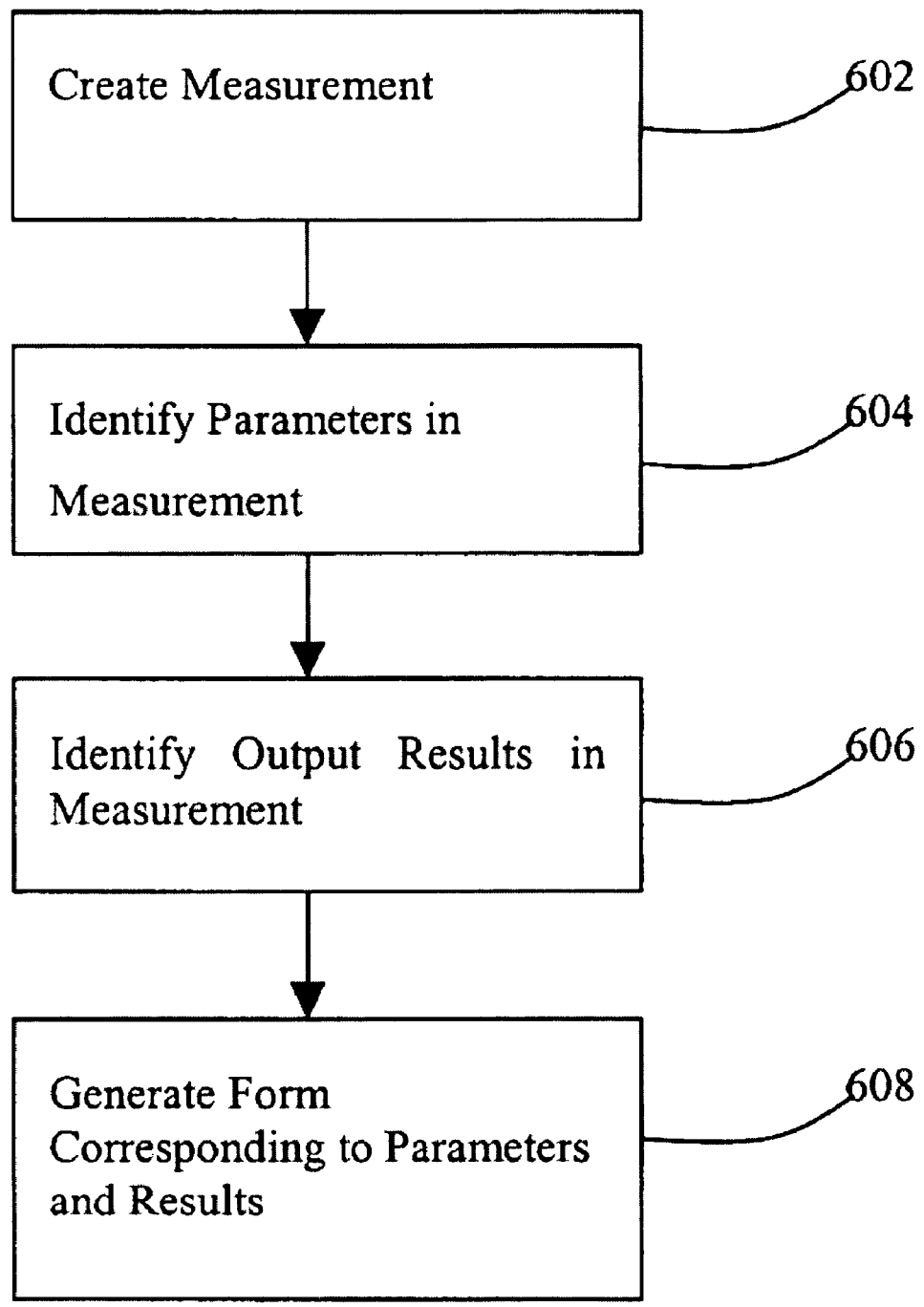
FIG. 6a shows a process for implementing a GUI-based interface for a measurement according to an embodiment of the invention.

FIG. 6a shows a flowchart of a process for automatically creating an interface according to an embodiment of the invention. At 602, the measurement is created. Parameters for the measurement are identified at 604. At 606, output parameters are identified for the measurement. At 608, an interface form is created that links to the measurement, in which fields in the form correspond to the identified parameters to the measurement.

Figures 6B, 7A:
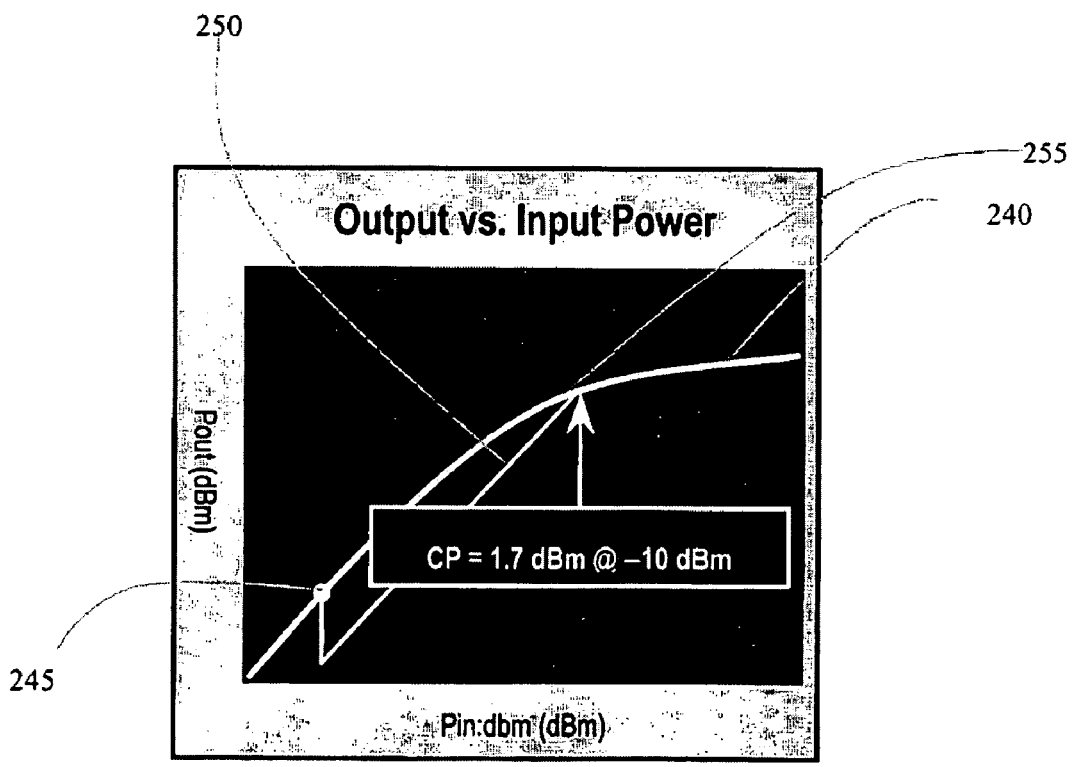
FIG. 6b depicts an illustrative example of a GUI-based form according to an embodiment of the invention.
FIG. 7a illustrates a plot of a measurement result according to an embodiment of the invention.

FIG. 6b shows an illustrative example of a form 295 that can be created for the compression point measurement discussed with respect to FIG. 5. It is noted that the defined parameters for the compression of FIG. 5 correspond to fields in the GUI-based form 295 of FIG. 6b. Any user that was familiar with a compression point measurement would be able to fill out this form even if the user is not familiar with the particular simulation language being employed. Notice that 'choose' buttons can be provided for the instance parameters, which allows them to be specified via the schematic if desired.

By implementing such forms, users can employ and reuse measurements without being required to learn and train in a simulation control language. Instead, a measurement can be used by anyone, including novice users, merely by accessing and entering parameters fields in the GUI-based form.

In one embodiment, self-documenting parameters and parameter fields are employed (e.g., parameters with range limits, units, text descriptions possibly partitioned between a short label and a full description, and indication that parameter is expecting a design object that could be selected on the schematic). In addition, the parameters may be grouped, with a common label and description for the group. The GUI can be implemented to employ results that display themselves. Libraries of measurements (along with library maintenance tools) can be GUI-based in one approach.

Probe and instance parameters can also be employed in the GUI-based form. As discussed in more detail below, probes allow measurement points to be specified as parameters. As such, probes can be identified and associated with one or more fields in the GUI form for the measurement. Such probes include probes that support single-ended, differential or common-mode quantities, as well as probes that support node, terminal or instance potentials (voltages) and terminal or instance flows (currents).

Display Attributes

In many cases, a simulation in an analog or mixed-signal application produces waveforms upon which further analysis is desired to determine the actual performance metric of interest. Visual display of the waveforms plays an important role for the designer when simulating a circuit.

For example, in the measurement illustrated in FIG. 5, which has an output graph shown in FIG. 7a, a loop is used along with a periodic steady-state (PSS) analysis to produce an array that contains the output power versus the input power which is depicted by power curve 240. In this example the actual figure of merit desired by the user may be the 1 dB compression point 255. This is the point where the gain has dropped by 1 dB from its small signal level. The measurement then returns the compression point as its output. This represents a very convenient result that can easily be printed, stored to a local variable, displayed in a table, etc. However, to assure that the compression point is measured correctly, users often would like to see the compression point calculation illustrated on the power curve 240. Seeing this gives the user confidence that the calculation was made correctly.

An example of a possible error that may occur is if one does not use the right small signal gain. The point where the small-signal gain is computed is illustrated as the dot 245 on the top of the marker 250. The fact that it is shown on the graph gives the user quick visual feedback that allows assurance that the output parameters are in their desired range. The graph in FIG. 7a consists of the raw data, in this case the power curve, plus a marker that illustrates the calculation. This is illustrated with the compression point, but the concept applies to virtually all scalar measurements made on waveforms, e.g. rise time, delay, maximum, settling time, intercept point, spurious free dynamic range, etc.

At a later point in time, the user may wish to re-visualize these results. However, in conventional systems, the simulator would be required to re-execute the simulation to that exact moment to allow the same display to be duplicated. Re-executing the entire simulation to reproduce a result set can be inefficient and wasteful of resources. Moreover, the prior approaches to compute the scalar result set are cumbersome to implement. This is because in traditional scripting languages, the function that computes the desired scalar result set is different from the function that displays the marker. Thus, the user must manually transfer the appropriate information from the calculation function to the marker function. In addition, the calculation function may not make all the necessary information readily available or accessible.

In one embodiment of the present invention, to make the display of scalar points more meaningful, the data that describes the marker and graph can be attached as attribute(s) ("display attribute(s)") to the scalar result set. When the result is plotted, the display attributes cause the marker to be generated automatically. Using such display attributes provides many benefits. First, generating markers becomes effortless for the end-user and for the author of the measurement. Second, since the display attributes are carried by the scalar output of the measurement, the entire graph with the marker can be generated and visually displayed without requiring the entire simulation to be re-executed. No additional information is necessary, since the display attributes travels with the scalar. Even if the scalar result is returned from the measurement where it was computed, the graph can be generated without having to manually move around a quantity of information.

Figure 7B:
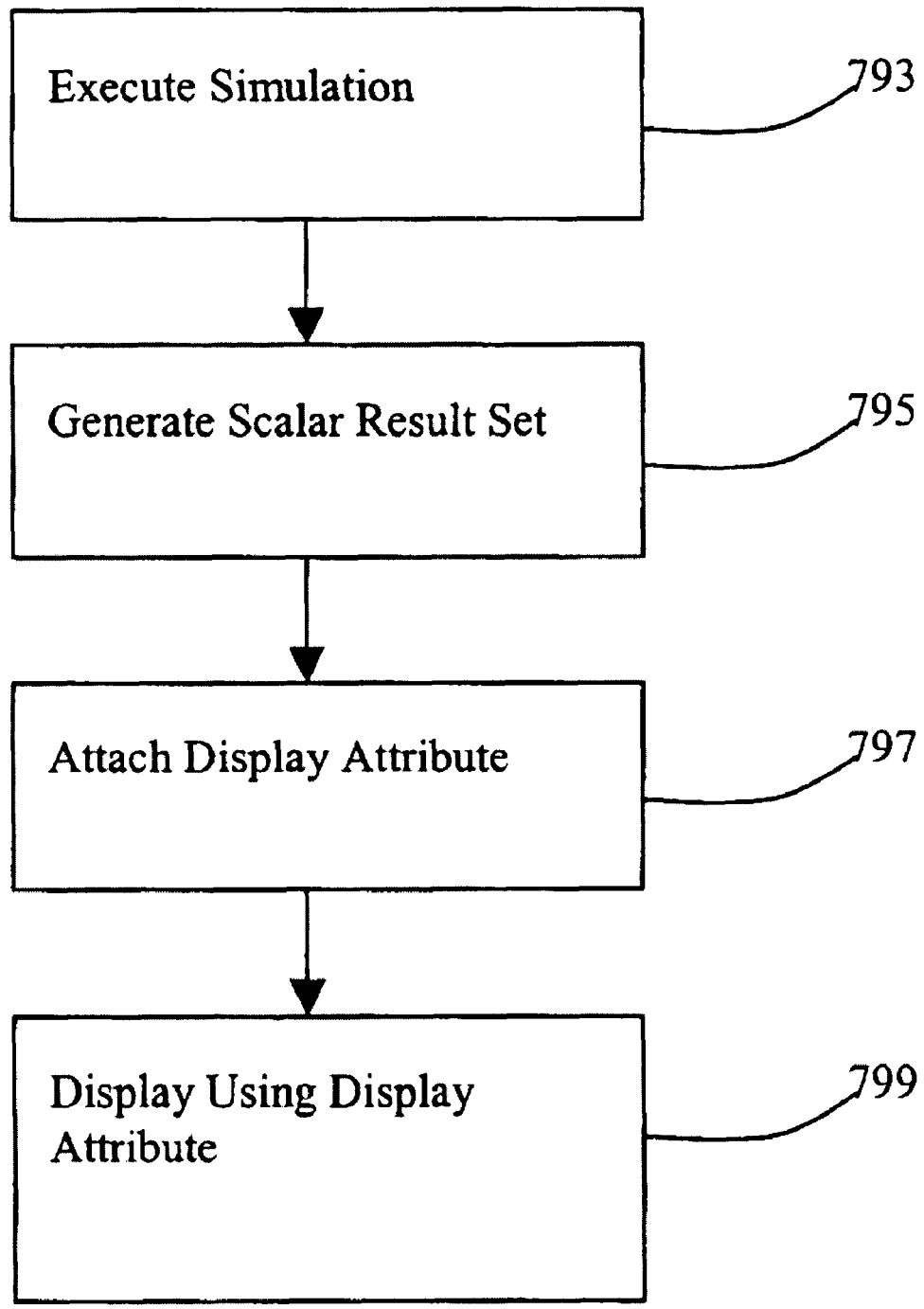
FIG. 7b shows a flowchart of an embodiment of a process for using display attributes.

FIG. 7b shows a flowchart of an embodiment of a process for implementing a display attribute. At 793, the simulation is executed this performed, for example, by executing a measurement. At 795, the scalar result set is generated. At 797, the display attributes are attached or otherwise associated with the result set. The additional attributes may be attached to the result by the computation function to allow the user to interactively update the marker, i.e. from the output graph depicted in FIG. 7a. The arguments of the computation function could be attached so that it can be reapplied if a subset of the parameters are altered. This may be done by utilizing keyboard or mouse events to select the points on the curve and perform the computational function with respect to the selected point or points.

Figure 7C:
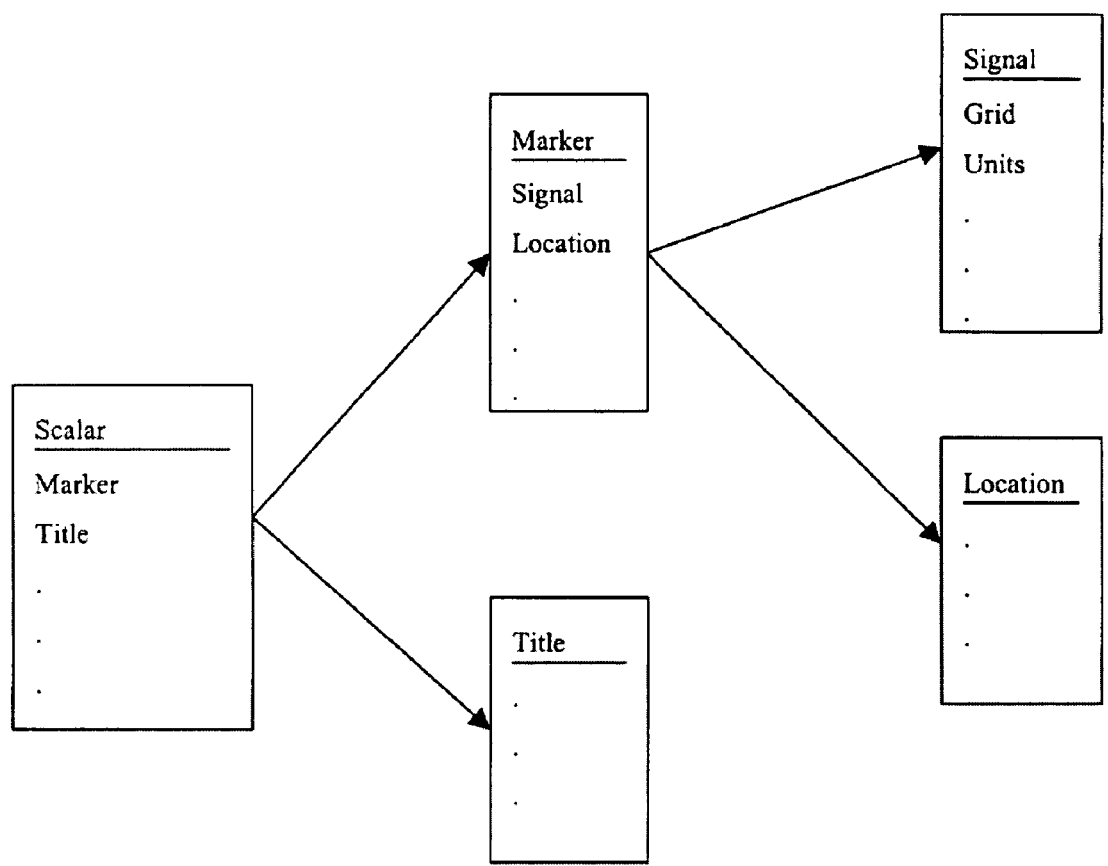
FIG. 7c conceptually depicts distribution of attributes which can be used to create a graph.

The display attributes may comprise information regarding how the data should be displayed. For example, the units, axis labels, graph titles, grid style, etc. can be attached to the result to assure that it would be displayed in an appropriate and informative manner thus causing the plotting function to utilize this information. Furthermore, if there are multiple ways of displaying data, attributes may be used to specify which way is desired. Consider a complex transfer function, which can be displayed as magnitude, phase, or real or imaginary parts, the hidden attribute can select which of these to use in the graph and also provide the units, axis labels, graph titles, grid style, etc. Since the data itself it not actually changed, the user can always display it in a different manner later. With reference to the graph shown in FIG. 7a, the display attributes would include, for example, grid display information, marker point information, title information (e.g., "Output v. Input Power"), display unit information (e.g., "dBm"), etc. FIG. 7c conceptually depicts distribution of attributes which can be used to create a graph.

The display attributes can be manually attached to the scalar result set. Alternatively, the display attributes are automatically attached to the scalar result set. In addition, the scalar result set can be compiled by functionals, which are functions that take vectors as input and return scalars. The functionals can automatically attach the attributes needed to display the results. At 799, the display attributes are then used to generate the visual results.

Display attributes can also be used to reduce the complexity of measurements, since with display attributes the measurements will not need instructions as to whether to display their output results. Instead, information is attached to the output results so that they can be displayed without any further processing as part of the measurements. That is, the output results can be manipulated by further programs. In this way, the same measurement can be use in a batch mode, where the output results would stored and not immediately displayed, and in an interactive mode, where the output results would be immediately displayed. The displays can be regenerated multiple times without rerunning the measurements. Graphs associated with output results that were archived perhaps months or years earlier could be easily displayed without rerunning the measurements. In addition, this aspect of the invention allows the output results from the simulation to be used later in the same design or for other designs. Display attributes can also attach information about the measurement that generated a result to the result. In this way, the result can be updated without re-specifying the measurement. Information such as the changes in place in the circuit when the result was generated, or any error messages that occurred in the generation of the measurement, could also be attached to the result as a hidden attribute.

To reemphasize the point, a significant advantage of this approach is that the display attributes essentially allow one to go backwards in time to extract how a particular result set was achieved without having to go through the entire simulation process. In this way, for the example given in FIG. 7a, users could interactively compute the compression point for different levels of compression without having to re-run the measurement, which involves an expensive simulation.

Therefore, described is an approach for attaching display attributes to data objects in a simulation control language, either automatically or at user direction. As part of the data structures, e.g., for functions and commands, information can be embedded to change their behavior based upon the presence and values of display attributes. For example, computation functions can attach attributes to their return values that are later interpreted by display commands and functions so as to influence how the results are displayed. The functions and measurements can attach hidden attributes to their return values. Display functions can be attached to return values of computation functions by way of display attributes that are evaluated when the result is displayed. Computation functions can attach parameter values to their return values so that the functions may be rerun with adjusted parameter values. In addition, a function can attach attributes to a return value to associate particular keyboard or mouse actions to increments or adjustments of particular parameter values. Measurements can attach their parameter values to their return values so that the measurement results can be updated simply by referencing the result and without re-specifying the measurement. A list of changes can be attached to the circuit or the simulator at the time a measurement result was generated to that result for the purposes of documentation, and perhaps reverting the circuit and simulator back to the state is had when the results were generated.

It should be noted that while described above, the measurements and functions can be used without display attributes.

Markers

Markers are annotations added to graphs to illustrate some important feature of one or more trace. As noted above, markers can be attached, e.g. to a trace, by way of an appropriate attribute, e.g., a display attribute. In one embodiment, the appropriate attribute is a group attribute that includes all the information needed to draw the marker. This section describes examples of markers suitably used in embodiments of the invention.

Markers take arguments that are used to specify how the text will appear when a marker is plotted. These text annotations are referred to as labels, and in one embodiment, there are three parameters used to control the content and placement of the text: label, dir, and angle. The label argument is a string. If it includes format codes, the value is interpolated into the label under direction of the format codes. If the label is not explicitly specified, then the default label of "% f" is used, which results in the value being printed along with its name and units.

Figure 17:
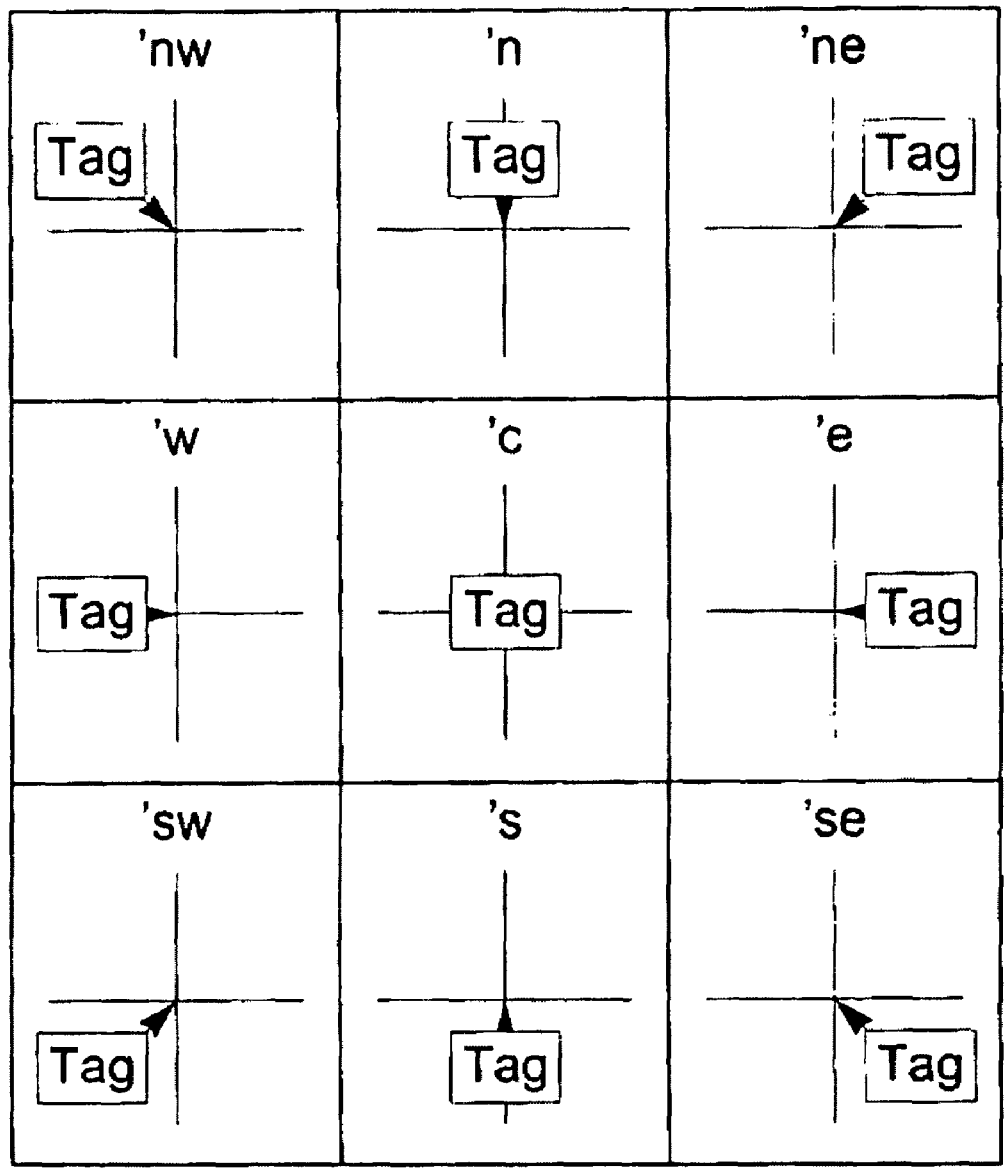
FIG. 17 shows an example table of label locations according to an embodiment of the invention.

Two additional arguments can be used to place the label. The first argument is named dir (or orient) and is a name that indicates where the label is relative to the point. It is one of the following names: 'c, 'e, 'ne, 'n, 'nw, 'w, 'sw, 's, and 'se, which represent centered, east, northeast, north, northwest, west, south, and southeast respectively, as shown in FIG. 17. Here, north means above the point, south means below the point, east means to the right of the point, and west means left of the point. In addition, centered implies middle-center justification, east implies middle-left justification, northeast implies lower-left justification, north implies lower-center justification, northwest implies lower-right justification, west implies middle-right justification, southeast implies upper-right justification, south implies upper-center justification, and southeast implies upper-left justification. The second argument is angle, the angle of the text. It is a real number. An angle of 0 implies that the text flows from left to right and an angle of 90 implies the text flows from bottom to top. The text is oriented and justified after it is rotated.

Note markers add text to a graph that is not associated with any particular graphic object. Normally notes are closed, but they can be opened by the user to expose the text. A note marker is specified by attaching a marker with type='note. The text is specified with the text parameter.

Error markers are like note markers in that they attach text to a graph that is not associated with any particular graphic object. However, by default the text is displayed very prominently, though it can be closed. An error marker is specified by attaching a marker with type='error. The text is specified with the text parameter. It takes an additional parameter severity that should be set to either 'notice, 'warning, or 'error.

Figure 18:
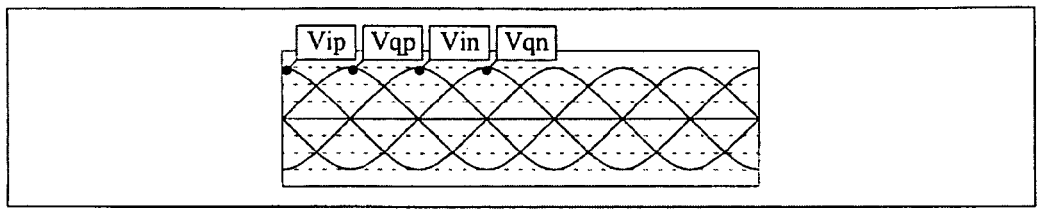
FIG. 18 illustrates an example of trace markers according to an embodiment of the invention.

A trace marker is text that is associated with a particular trace, but does not have a particular location on the trace. The display tool would place it as it sees fit. A trace marker is specified by attaching a marker with type='trace. It takes the standard label parameters. If no label parameter is specified, the name of the trace is used as the label, which is particularly useful for identifying traces in preparation for producing a black and white hardcopy. This is illustrated in FIG. 18.

Figure 19:
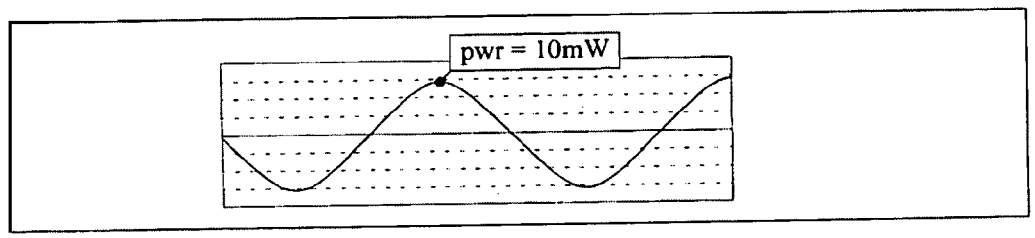
FIG. 19 illustrates an example of a trace marker attached to a scalar according to an embodiment of the invention.

When a trace marker is attached to a trace, in one embodiment, format codes are not used to access a value, though it is possible to use codes that access attributes if the associated attributes exist. It is also possible to apply a trace marker to a scalar, in which case the signal from which the scalar was derived should be specified to the marker as part of the markers attribute group. In this case, the format codes that access a value can be used. This is useful for attaching labels to traces that describe an important property of that trace, but for which there is no obvious location. FIG. 19 shows an example of a trace marker attached to a scalar.

Figure 20:
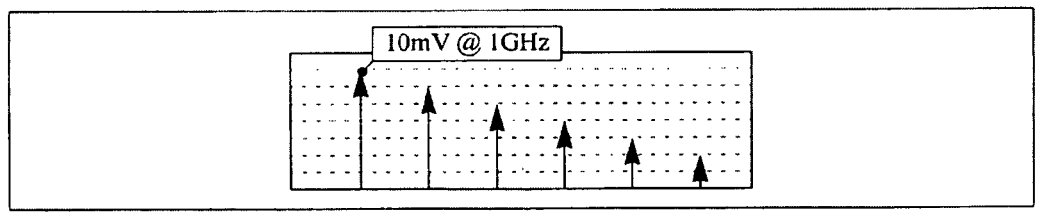
FIG. 20 illustrates an example of a trace with a marker according to an embodiment of the invention.

A point marker is text that is associated with a particular point. It is similar to the trace marker, with the distinction being that the location of the marker is specified and fixed and need not be on the trace. It takes that standard label parameters along with a location parameter, loc, which is a point. As with the trace marker, it can be attached to a signal or a scalar. With a point marker, the format codes used in the label access values from loc. A point marker is illustrated in FIG. 20.

An x marker would place a vertical line that always spanned the graph at a particular location defined by an x value.

Any marker would place a horizontal line that always spanned the graph at a particular location defined by an y value.

Figure 21:
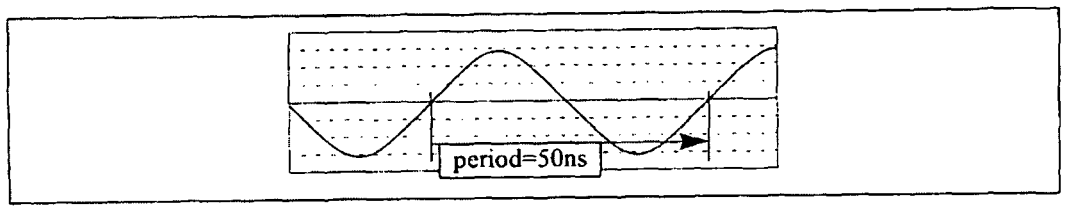
FIG. 21 illustrates an example of a deltax marker according to an embodiment of the invention.

A deltax marker is text that is associated with a the distance in the x direction between two points. The two points may be on a single trace, or on two different traces. If it is a scalar, the signal or signals should be specified with the marker so that they can be plotted with the marker. The two points define the beginning and the ending of the interval of interest are specified with refloc and loc. The label is specified with the traditional label parameters. An example deltax marker is shown in FIG. 21.

Figure 22:
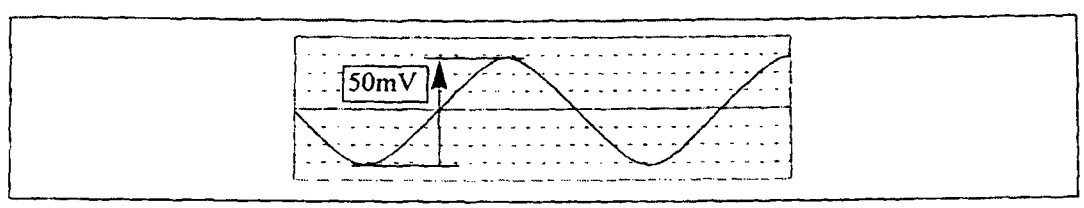
FIG. 22 illustrates an example of a deltay marker according to an embodiment of the invention.

A deltay marker is text that is associated with a the distance in they direction between two points. The two points may be on a single trace, or on two different traces. If it is a scalar the signal or signals should be specified with the marker so that they can be plotted with the marker. The two points define the beginning and the ending of the interval of interest are specified with refloc and loc. The label is specified with the traditional label parameters. An example of the use of a deltay marker is as follows (which is illustrated in FIG. 22):

point min=min(Vout)
    point max=max(Vout)
    point pp=max−min
    view  pp::mkr={type='deltay, sig=Vout, refloc=min, loc=max}

Figure 23:
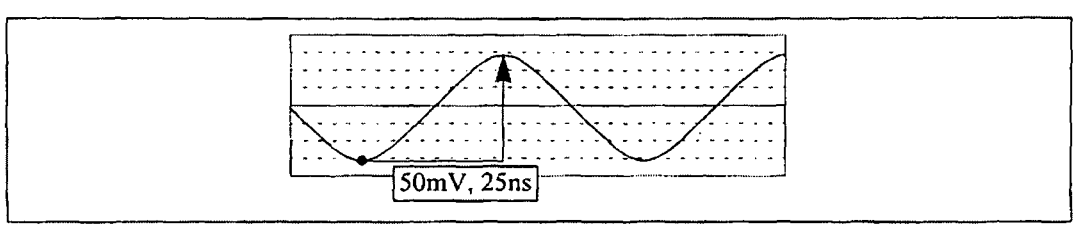
FIG. 23 illustrates an example of a deltaxy marker according to an embodiment of the invention.

A deltaxy marker is text that is associated with a the distance between two points. The two points may be on a single trace, or on two different traces. If it is a scalar the signal or signals should be specified with the marker so that they can be plotted with the marker. The two points define the beginning and the ending of the interval of interest are specified with refloc and loc. The label is specified with the traditional label parameters. An example is shown in FIG. 23.

Figure 24A:
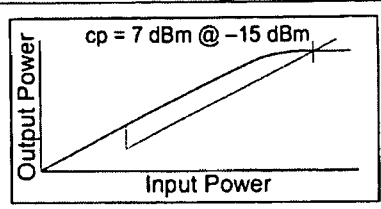
FIGS. 24a-b illustrate examples of CP markers according to an embodiment of the invention.
Figure 24B:
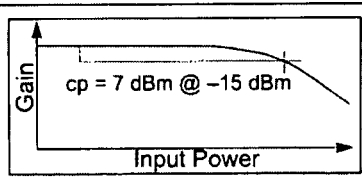

A compression point, or cp, marker is a specialized marker suitable for displaying the compression point on a power transfer curve. A cp marker is specified by attaching a marker with type='cp to either a point or a signal. If attached to a point, the sig parameter should be specified so that when plotted, the marker is drawn with the appropriate signal. The y-value of the point is assumed to be the output power at the compression point and its x-value is assumed to be the input power at the compression point. It attached to a signal, then the point should be given with the loc parameter. It takes that standard label parameters along with a reference location parameter, refloc, which is the extrapolation point. A cp marker is illustrated in FIG. 24*a*. A cp marker also support gain compression measurements, as shown in FIG. 24*b*.

Figure 25:
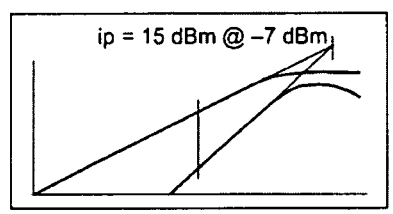
FIG. 25 illustrates an example of an intercept point marker according to an embodiment of the invention.

A intercept point, or ip, marker is a specialized marker suitable for displaying the intercept point on a power transfer curve. A ip marker is specified by attaching a marker with type='ip to a either a point (the intercept point) or a signal (the power transfer curve of the nth order distortion term). If attached to a point, the sig parameter specified so that when plotted the marker is drawn with the appropriate signal. In addition, other parameters specify power transfer curve of the fundamental term. The y-value of the point is assumed to be the output power at the intercept point and its x-value is assumed to be the input power at the intercept point. It attached to a signal, then the point should be given with the loc parameter. It takes label parameters along with a reference location parameter, refloc, which is the x value for the extrapolation points. An order parameter is used to specify the order of the distortion. A ip marker is illustrated in FIG. 25.

A line marker takes a point and a slope and draws a line across the extent of the graph. One application for a line marker is to annotate a log-log graph of either admittance or impedance show the immittance of basic components such as resistors, capacitors, and inductors, as shown in FIG. 26. Line markers allow users to quickly build a model for the inductor. A line marker causes a line segment to be drawn between two points. A line marker is specified by attaching a marker with type='line to a scalar or to a signal. If it is a scalar, a signal should be specified with the marker using the sig member so that it can be plotted with the marker. The two points define the beginning and the ending of the line segment are specified with refloc and loc. The label is specified with the traditional label parameters.

A circle marker causes a circle to be drawn with a given center and radius. If it is a scalar, a signal should be specified with the marker using the sig member so that it can be plotted with the marker. The center of the circle is specified with a point, loc, and the radius with a real number, radius. The label is specified with the traditional label parameters. An example that uses the circle marker is shown in FIG. 27. This example is used to plot the noise circles for an amplifier. Noise circles are used to show designers how the noise of an amplifier varies as a function of the source impedance.

It is also possible to apply mask markers to signals, which are bounds that vary as a function of the abscissa. To do so, a mask attribute is attached to the signal. There are twelve example types of mask markers, 'above, 'below, right, left, 'inside, 'outside, 'not_above, 'not_below, not_right, not_left, 'not_inside, and 'not_outside. Each takes a signal as an argument mask that defines a region, as illustrated in the table of FIG. 28. Plotting a signal that has a mask attribute causes the mask to itself to be plotted and any violations to be highlighted. The mask may be applied to either a scalar or a trace. When applying a mask to a scalar, the signal from which the scalar was derived should be specified to the marker using the sig member of the markers attribute group. In this case, the format codes that access a value can be used.

Data Analysis

Analysis of simulation data can occur in at least one of two ways. Either the analysis occurs during the simulation or after the simulation. Performing analysis "on-the-fly" during the simulation is generally preferred if the analysis can be specified before the simulation occurs, because the data analysis routines can control the simulator to get better results or terminate the simulation early once the desired results have been achieved. For example, when performing certain types of activities, e.g., FFT analysis, real-time data analysis can direct the simulator to place time points at the FFT sample points to avoid interpolation error. Or, when computing settling time, it can terminate the simulation once the settling time has been determined.

Post-processing or data analysis after the simulation may be more suitable under certain circumstances, particularly if it is only possible to ascertain what data analysis is required after the simulation is complete. Thus, both types may be required. However, to be efficient, each type of analysis may require a different implementation of the underlying mathematical functions. Analysis during simulation normally calls for the functions to operate a point-at-a-time as the data becomes available. This allows control over the simulator in real time. With post-processing, the data analysis should be performed on the data vectors as a whole for best efficiency. A point-at-a-time approach used here would not normally provide competitive performance.

In a present embodiment, this problem is addressed by using multiple versions of each mathematical function and operator for the data analysis, with each version optimized for a particular situation. Both versions possess the same identifier or recognized name, but the actual version that is executed depends upon the current circumstances. Thus, a first version of the function or operator may be optimized for on-the-fly processing, and the second version optimized for post-processing. Each would be appropriately called if the circumstances match their intended execution parameters.

Figure 9:
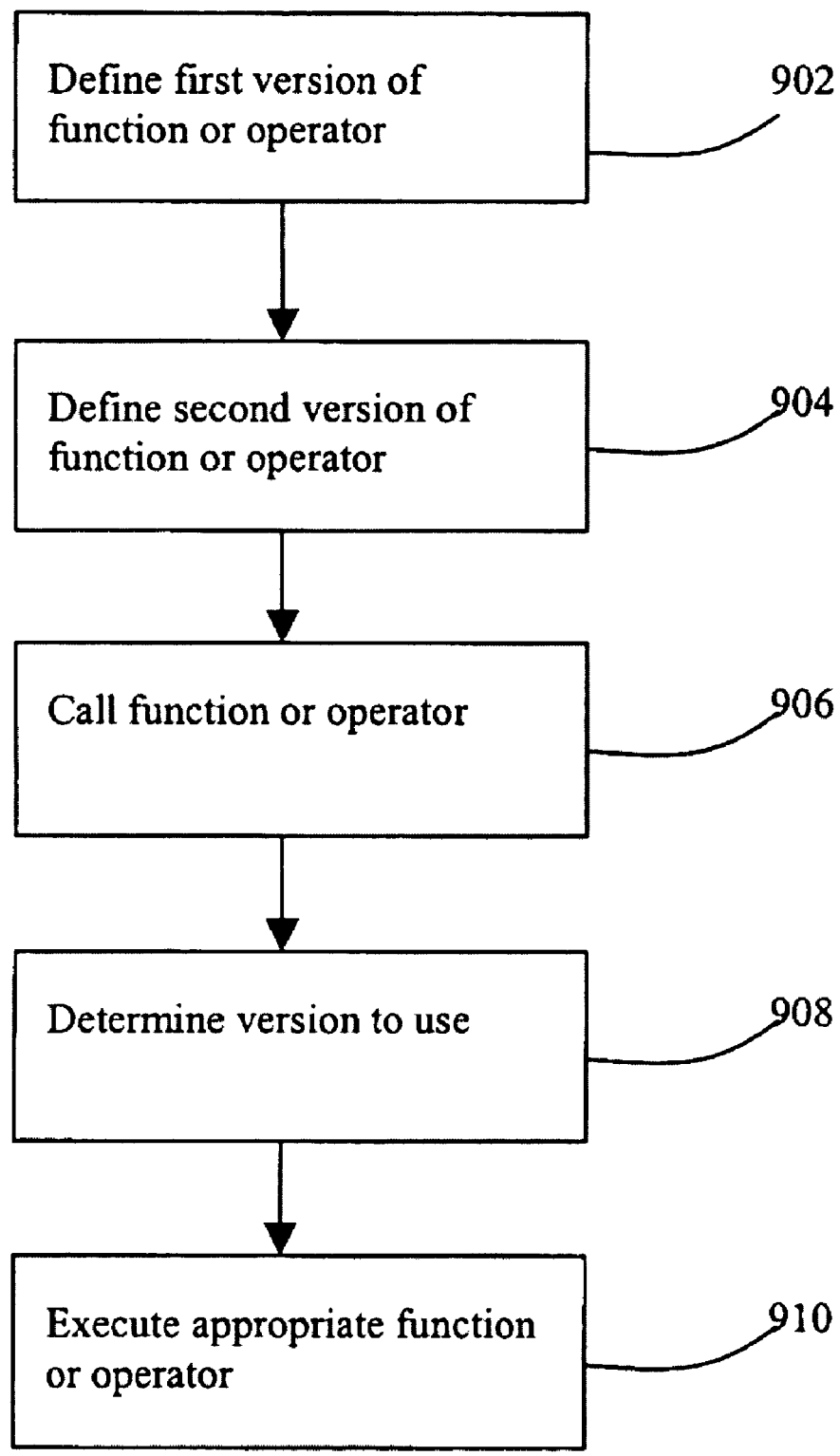
FIG. 9 shows a flowchart of a process for multi-defining a function or operator according to an embodiment of the invention.

FIG. 9 shows a flowchart of a process for implementing this aspect of the present embodiment. At 902, a first version of the function or operator is defined. At 904, a second version of the function or operator is defined. In one approach, each version takes the same or similar arguments. In operation, the defined function or operator is called (906). The particular version that is used is determined from the actual type of the arguments and the setting in which it is being used (908). For example, different versions for a single function or operator may exist for post- or on-the-fly-processing, for time-aligned data (as generated by a circuit simulator) or non-time-aligned data (as generated by a timing or logic simulator), for continuous- or discrete-valued signals, or for real and complex signals. Once the appropriate version is identified, it is executed to perform the data analysis (910).

In effect, the user selects one function that appears independent of the data types and setting, and through function/ operator overloading, the most efficient of many possible implementations is used. Thus, function and operator overloading is performed for the sake of efficiency even when the arguments of the function or operator are seemingly identical between the two versions (the choice between the multiple versions of the functions would be made on the basis of when the arguments were generated and what source they came from, not based on the underlying data types). This concept can also be extended to support overloading for functions and operators even when their argument types are different. For example, there might be two versions of the FFT function, one for real-valued waveforms and the other for complex-valued waveforms, but they would have the same name and they would look like one function to the user. In addition, function and operator overloading can be based on argument type and dimension in the context of a simulation analysis and control language.

Run Statements

A measurement can be executed using a controllable and flexible control statements, which in one embodiment of the invention comprise the "run" or "show" commands. In one approach, the run command is configured to execute one or more measurements and prints a return values. The show command is configured to also execute one or more measurements, but it passes any return values for graphical display (e.g., using a view command). Both measurements and analyses can be executed using the run and show commands. As used for this section, analyses are predefined or built-in measurements while measurements are user-defined analyses.

Figure 16:
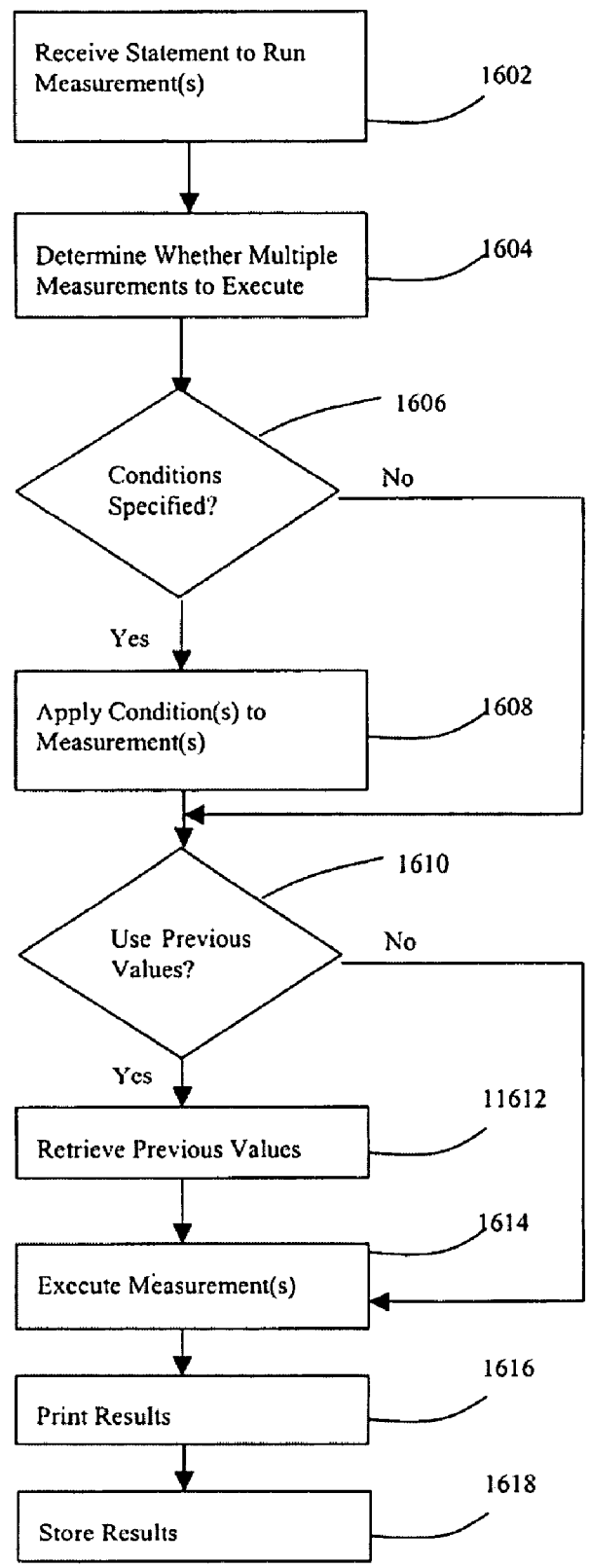
FIG. 16 shows a flowchart of an embodiment of a process for implementing a run command.

Described in this section is one embodiment of an approach for implementing the run and show actions. FIG. 16 shows a flowchart of an embodiment of a process for implementing a run command according to an embodiment of the invention at 1602, the run command is received for execution. The run command is a statement in which the name or names of the measurements to execute are provided as keywords to the command. At 1604, a determination is made whether multiple measurements are to be executed. If multiple measurements are named in the run statement, they can be run simultaneously, e.g., by determining if multiple processors, threads, or other parallelizing mechanisms are available and employing the available mechanism to simultaneously execute the measurements. In addition, individual measurements can be executed as parallel iterative blocks (see above regarding foreach loops). Thus, the described control statement inherently allows parallel execution of measurements.

As explained in more detail below, conditions specify sets of one or more changes or parameters that can be applied to a circuit for simulation. At 1606, a determination is made whether condition(s) have been specified for the measurement(s). If so, then the conditions are applied during the execution of the measurement (1608). In effect, the run command iterates one or more measurements over a set or range of conditions. The conditions could be applied to a single measurement or to all of the named measurements. In the present embodiment, the run command would also add the list of conditions to the measurement results as an item of documentation. Once the measurement was complete, the conditions could be removed. As described below, the conditions can also be tracked and saved for later use.

At 1610, a determination is made whether parameter values from previous runs should be used in the present execution of the run command. In this embodiment of the invention, when executing a run command, the measurement parameters and results of the statement are stored. At a later execution, this allows a previous measurement with previous parameter values to be used without requiring these values to be re-specified (1612). In addition, this allows previous results to be immediately available for comparison with present results. In one approach, the system can be configured to detect whether measurement have changed and to ensure that the run command would only run measurements that were out-of-date.

In one implementation, the run command causes measurement results to be assigned to local variables. The run command would also attach information to the local variable that would allow the variable to be updated by rerunning the measurement simply by specifying that the variable itself be rerun. The run command reruns the previous set of measurements if no new ones are specified.

At 1614, the measurement(s) are executed. As noted above, multiple measurements can be run simultaneously. It is contemplated that the measurements can be run in the background, such that the user need not wait for the measurements to finish before proceeding.

The results/return values are thereafter printed (1616). In one approach, the run command would arrange the results in the form of a family for easy viewing. Plotting a result from a measurement that is still running causes partial results to be displayed and then automatically periodically updated until the measurement completes.

At 1618, the results and parameters for the present run can be stored for future use. This allows the current measurement results to be compared against previous measurement results. The comparison can be performed automatically, or under manual control. Moreover, storing this information this allows the parameters to be re-used without being specified at the later run.

As explained in more detail below, aliases can be created for measurements. In one embodiment of the invention, the run command can be configured to create aliased measurements on the fly. The aliases could include conditions or comparisons.

The show command is used in the same way as the run command, and accepts all of the same keywords. However, besides printing the return values from the measurements it runs, it also causes them to be viewed in a graphical display. In this way, the show command is the run command combined with the view command. The results from each measurement are displayed in their own window, and if the results are already displayed, the results are updated. The show command will also plot previous results along with the current measurement results for comparison. In addition, with the show command, the new and comparison results can be both printed and graphically displayed.

The following will describe illustrative examples of syntax and format for the run command. Consider a run command that executes two measurements. If the appropriate mechanisms are available, the measurements are run simultaneously, and execution continues from the run command once all measurements have completed. For example, if nf and cp are two measurements, then
    run nf, cp
runs both and sets the active dataset to be the primary dataset generated by the first measurement listed, in this case nf. Parameters can be passed into the measurements.
    run nf(start=55 MHz, stop=26 GHz), cp(start=−20_dBm, stop=10_dBm)

Once values have been passed into measurements, the parameters retain these values for later runs from the same context. Thus, once start and stop have been specified for nf and cp as above,
    run nf, cp
will rerun these measurements with the specified values rather than with the default values. If you would like to temporarily set the measurements parameters, but not have the changes persist, add the keyword trial after the measurement where the parameters are specified. Thus,
    run cp(stop=20_dBm) trial
would result in cp running with stop=20_dBm, but the next time it was run stop again returns to its value of 10_dBm that was specified previously.
To specify that the measurements should be run with a default parameter value, pass null for the value:
    run nf(start='null, stop='null), cp(start='null, stop='null)
Or one could simply reset the measurements and then rerun them:
    reset nf, cp
    run nf, cp
A run command with no arguments repeats the most recent run command from the same context. Thus,
    run
reruns the nf and cp measurements.

Keywords are used to modify the behavior of the measurements. Keywords can be associated with a single measurements, or all the measurements specified on the run command. The placement of the keyword relative to the comma that separates the measurements determines the scope of its influence. If the keyword is place between the measurement and its comma, then it applies only to that measurement. If it is placed after the last comma, it applies to all measurements.

The with keyword specifies conditions that persist for the duration of the measurement. A single assignment or condition is specified after the with keyword. If multiple conditions are to be applied, use multiple with keywords.
    run nf with temp=0, cp with slow
    run nf, cp, with temp=0 with slow
The foreach keyword is used to specify a series of conditions under which the measurements are applied.
    run nf, cp, foreach {fast, typ, slow}
repeats nf and cp for each corner where fast, typ, and slow are assumed to be predefined condition sets. Equivalently, one could use
    run nf, cp, foreach corner
where corner is assumed to be a set of equivalent condition sets combined together by a corners statement. One could also use the foreach keyword to iterate the measurements over a list of parameter values.
    run nf, cp, foreach VDD from {3,4,5}
Similarly, one could also use the swp function to sweep the measurements over a range of parameter values.
    run nf, cp, foreach VDD from swp(start=3, stop=5, step=1)
Results for a foreach loop are arranged as a family. So,
    view out@4
plots the results for out with VDD=4 V.

Multiple foreach lists can be specified, in which the lists are traversed in combination, with the list given first becoming the innermost.
    run nf, cp, foreach VDD from {3,4,5} foreach {fast, typ, slow}
The conditions are applied in the order given, so with
    run nf, cp, foreach {fast, typ, slow} with temp=25 will all be run with temp=25 regardless of whether temp is set in a corner because with temp=25 occurs later on the command.

The results of a measurement can be compared with previous results using the vs keyword. The name of a data hierarchy would follow the keyword

| run cp vs prev | | | | |
|---|---|---|---|---|
| | current | prev | change | % change |
| cp | 8 dBm @ −2 dBm | 10 dBm | −2 dBm | −20% |

In this case, the cp measurement is run and its return value is printed along with the one saved away in the prev data hierarchy.

It is also possible to define measurement aliases on the fly by adding the as keyword when running a measurement with a run or show command.

run ac(center=1 MHz, span=1 kHz) as pb
    run ac(start=1_Hz, stop=10 MHz) as sb In these cases, the alias is created before the analyses are run, and so the default parameter values for the base AC analysis are not affected. The as keyword must follow a measurement, and applies only to that measurement. If the as keyword follows the with, foreach, or vs keyword, the keyword also become associated with the alias. Thus, if the alias is rerun, the keywords are automatically applied. For example, run dc with temp=50 as dcat50
then
    run dcat50
reruns the dc analysis, again with temp=50.

A run command with no arguments will repeat the last run command. In this case, any keywords specified apply to all measurements.

run nf sparams ip3
    run with Ibias=100 uA vs prev
    run with Ibias=150 uA

In this example, the three measurements from the first run command are rerun in the second, this time with Ibias=100 uA while comparing with the previous results. Then in the third run command, the measurements are again repeated with Ibias=150 ua, and the results are again compared against the previous results.

The return value of a measurement can be made available in the dataset produced by the measurement. But it can also be available to be stored to a local variable. To do so, assign the value to the variable on the run command.

point cp1
    run cp1=cp

If a measurement returns more than one value, it is returned as a group.

Besides assigning the value to cp1, the run command also attaches an attribute, meas=cp. Now, one can rerun the above simply with run cp1

In this case, MDL recognizes cp1 as a local variable and looks for the meas attribute, and if present runs that measurement and stores the result in cp1.

Alias Measurements and Functions

Measurements may be shared among multiple users. However, while a particular shared measurement might do what the user needs, it may not provide an optimum interface. It may use a cumbersome set of parameters or may not produce the exact form of the desired result. Modifying the measurement to suit the user's needs may be problematic. If the user were to modify the measurement to be nonstandard, extensive support and maintenance for the measurement may be required at additional expense and effort, e.g., if updated versions of the measurement is released, then the later release would also have to be modified. Also, such modifications could be intimidating for some users if the measurements are complex or subtle.

According to one embodiment, a measurement alias provides a way to modify the interface or functionality of an existing measurement without modifying the measurement itself. A measurement alias is a defined construct that encapsulates the underlying measurement, allowing changes to various aspects of the measurement such as its name, default values of the parameters, names and meanings of parameters, and to the results produced.

Figure 10:
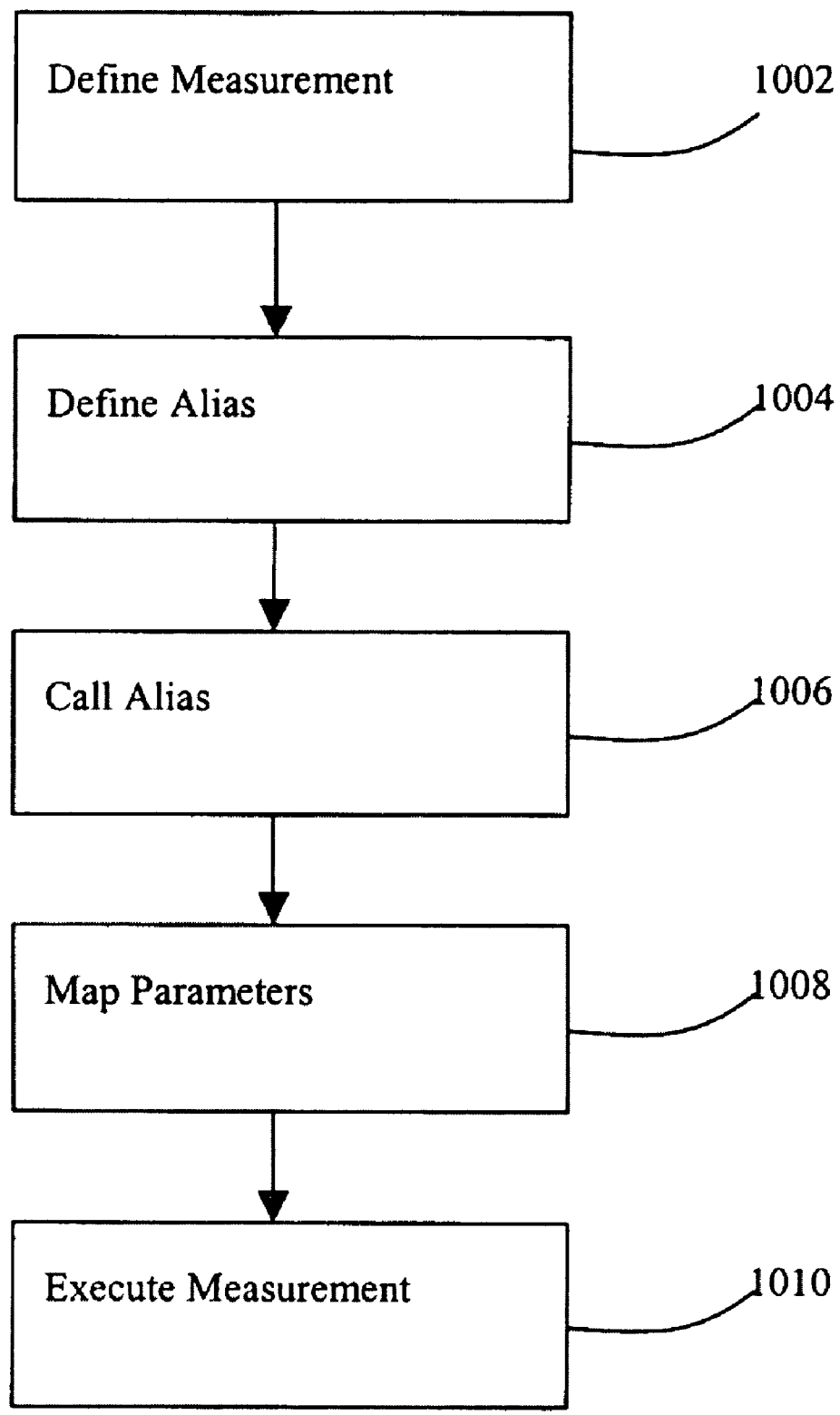
FIG. 10 shows a flowchart of a process for implementing a measurement alias according to an embodiment of the invention.

FIG. 10 shows a flowchart of a method for implementing a measurement alias according to an embodiment of the invention. At 1002, the underlying base measurement is defined. At 1004, the measurement alias is defined. As noted, the measurement alias references the underlying measurement, but may change one or more aspects of the underlying measurement. For example, new parameters can be declared for the measurement alias, and these newly declared parameters can be used to specify the parameters of the underlying measurement. When the alias is called (1006), it is the underlying measurement that gets executed (1010). However, since the alias might have redefined certain parameters, the declared parameters of the alias are first mapped to the parameters of the underlying measurement (1008). Any unspecified parameters are inherited from the base measurement.

In one embodiment of the invention, measurement alias definitions are similar in form to measurement definitions, but includes a call to the underlying measurement. In the embodied language, the alias definition is preceded with the keyword alias. In one embodiment, there must be one and only one run statement, and that it may run one and only one sub measurement. For example, consider the following example of a measurement alias:

```
alias measurement transient {
    input real tstop
    input real tstart
    input real tstep
    input real delmax
    run tran(stop = tstop, start = tstart, step = tstep, maxstep = delmax)
}
```

In this example, the new measurement alias "transient" will call the underlying measurement "tran". Regardless of the names or quantity of the input parameters that may be needed for the underlying measurement, the interface for this measurement alias only defines the four input parameters in this alias definition (i.e., tstop, tstart, tstep, and delmax). These parameters are mapped to the appropriate parameters for the base measurement when the run statement is executed (the run statement is explained in more detail below).

Once defined, a measurement alias cannot be distinguished from a measurement by end-users. Thus, one could use:

```
run transient( tstop = 10ns )
to run the alias.
```

In this embodiment, if the parameters are given by order rather than be name, the alias parameters are expected first, followed by those parameters of the base measurement that have not been overridden. One could simply encapsulate tran in a traditional measurement and achieve the same basic effect as an alias. In an embodiment, an alias has some or all of the following properties. First, an alias supports the specified parameters along with any unbound parameters for the base analysis. Second, the help description for the alias is built up starting from the help description for the base measurement. In addition, the name given to the dataset is taken from the alias rather than the base analysis. Thus, the dataset produced by tran is exported from transient without inserting an extra level of hierarchy. Expressions given with an alias measurement could run concurrently with the base measurement. Moreover, conditions can be associated with measurement aliases. Additionally, comparisons can be associated with measurement aliases. Some or all of these properties differentiate an alias from a measurement.

Measurement aliases have many uses. For example, one could use it to change the interface of an existing measurement to make it more comfortable for the user or easier to use. Consider this example where the meaning of the lin and log parameters are changed to make them mean steps rather than points:

```
alias measurement ac {
  input int lin
  input int log
  run ac (lin = lin+1, log = log+1)
}
```

Notice that the alias may have the same name as the base measurement, in which case in one embodiment, the base measurement is hidden and cannot be called directly after being aliased unless the alias is deleted. Or consider the case where a user wants a parameter value to track a local variable:

```
alias measurement sineResp {
  extern real period
  run tran(stop = 3*period)
}
```

There is the case where the user wants to add some output processing and plotting.

```
alias measurement histogram {
  input inst clk
  input int bits
  run sineResp(clk=clk, bits=bits)
  export signal smpled = in @ smpl(clk:delay, clk:period)
  output int@ minhits = min(histogram(smpld, pow(2,
    bits))) -- "hits" -- "Hits per bin"
  view minhits
}
```

Finally, it is possible to associate conditions and comparisons with an alias. For example, as shown in the following:

```
alias measurement opAt50 {
  run dc
} with temp=50
and
alias measurement opVsPrev {
  run dc
} vs prev
```

A short hand form for defining measurement alias is available to allow quick change to the name of a measurement and specify fixed values for one or more parameters. For example, consider the case of a filter designer that would like to routinely run two different AC analyses, one over the passband of the filter, and the other over the stopband of the filter. It would be convenient to define two measurement aliases for the AC analysis as follows
   alias measurement pb=ac(center=1 MHz, span=1 kHz)
   alias measurement sb=ac(start=1_Hz, stop=10 MHz)
One could now measure both the passband and the stop band of the filter using
   run pb, sb
Changing the name of a measurement also changes the name of the dataset it produces. So the results of these two measurements can be plotted with
   view pb→out sb→out.

Interactive Datasheets

In conventional approaches, simulation result data is typically displayed in a graphical format. The simulation parameters and results are not typically displayed as true "numbers." An embodiment of the present invention provides an advanced non-graphical approach to displaying data. FIG. 8 shows an example of a single form that a user could efficiently use during the "simulate, view, update" loop. It allows the user to modify the local version of the circuit that is maintained by the simulator during a session, and it also allows the simulation output parameters to be displayed in the form of a Data Sheet 271, as shown in the illustrative example of FIG. 8. A significant advantage of this approach over the graphical approach is that a greater data density can be presented to the user in this approach.

Section 270 is an edit section that allows changes to be made to the input parameters. The user can be given the opportunity to select values from lists, by browsing the circuit, or from the schematic as appropriate. The user can either set individual circuit, instance, model, and simulator paramters, or can set them as a group by using corners (altergroup) or by reverting to an earlier parameter set (conditions).

Section 275 is a history section, which allows the user to manage previously generated results. The circuit conditions associated with every simulation made in the current run is available along with the simulation result. In addition, any conditions/output parameter pair that is named is also available even though it may have been run in a previous session. From this section one can view the contexts and output parameters, one can save output parameters, one can set the reference output parameters, and one can compare two condition sets. This interface can be used to manage the history features described with respect to FIGS. 3 and 4.

Section 280 is a results section that lists the user defined specifications. Each specification can be associated with a measurement that is assumed to return one or more scalar values and can generate one or more graphs. The user can associate goals and bounds with each measured value. The goals can be used for optimization and the bounds can be used with Monte Carlo to compute yields. Selecting a scalar measurement result brings up the associated graph for that result. In this way, if a number looks suspicious, the user can quickly plot the data used when computing the measurement result, and show both the result and the data.

Each field can be presented with a given background color and a text color, both of which may be significant. The background color conveys whether the information in the field is up-do-date. For example, the blue color may be used to convey that the data is up-do-date, gray to impliy that it is not, and aqua color to imply that the data is user specified. When a simulation is run, if the circuit conditions have been changed, the background for all measurements turns gray indicating that the results are now out-of-date. Then as the measurements complete, the associated background turns blue, which gives the user additional feedback on the progress of the simulation. In the example, some fields are shown as green. That signifies an immediate action button. Green fields in the Graphs and Tables column can be used to indicate that the graph or table should be displayed immediately (out-of-date or not) when the button is pressed. A text color of green implies that the data is within the goals, a text color of yellow implies that it is within the bounds but not the goals, a text color of red implies that it is outside the bounds, and a text color of white indicates that there are no bounds associated with the field. Many fields have toggle buttons that indicates which fields should be updated when the user requests an update, which is done using the simulate section. The fields in the Graphs and Tables column also have toggle buttons that are used to indicate that the graphs should be displayed when the measurement value is updated.

The columns used in this section can be user configurable. The columns shown are merely examples, as other columns can be employed in the invention. Such additional columns may include, for example, Improvement From Previous, % Improvement From Previous, Improvement From Reference, % Improvement From Reference, Reference, Best, Conditions, Selected Parameter Value, Conditions, % Deviation, Selected Measurement Parameters, and Progress Towards Goal Bar. The user can specify which columns are presented and in what order. The Improvement from Previous columns report on the change from the most recent results available. The Reference and Improvement from Reference report on the result and change in results from the designated reference conditions. The Conditions and Selected Parameter Value are used to indicate the conditions of the circuit at the time the measurements were made. This differs from the With column which enforces conditions. For example, Vdd=3V in the Selected Parameter Value implies that Vdd happened to be set to 3V when the measurement was made, whereas if it were found in the With column, it indicates that the value of Vdd was overridden and set to 3V for the duration of the measurement. Typically the With column is used to set the supply voltage, the temperature, the load, or the process corner as variants of specific measurements. One could also consider removing the units from each column and having an additional Units column. The form can also be implemented to create column titles from corners, so users can see results for fast, typical, and slow in different columns.

The actual measurements reported on in this section are chosen using the Configure button on the Results header bar, as are the preferred columns. Specific rows and columns can be hidden when not needed to make the form smaller. Along with measurements, rows in the table can be dedicated to headers/separators. In this way the different types of specs can be grouped and easily distinguished.

Section 285 is the run section and contains interface control objects, e.g., buttons, that when actuated, cause the data in the section 280 to be updated. The user can define their own buttons, each of which would result in a pre-specified group of output parameters being updated. These user-defined buttons are shown in the second row. The user would right-click in order to access special run options, such as running in background or running at a set time.

Section 290 is a status section that shows what the simulator is currently working on and what is the estimated time to completion. This is shown using both the Done in field as well as a progress bar. Also shown are the messages generated by the simulator with filters and suppressors that make it easier to deal with large numbers of messages. The Show button is used to highlight nodes/instances mentioned in the message and the Hide button is use to suppress messages that the user has identified as being uninteresting.

In each of the sections 270, 275, 280, 285, and 290 the user can select the each field to additional capabilities of each field. For example, a right-click in the Name field allows the the user to specify the parameters of the measurement. A right-click in a field associated with a measured value gives access to the conditions of the circuit when the measurement was made and gives the user the option of setting or reverting the current state of the circuit back to that conditions. A right-click can also be used to configure the field, set display resolution and format, set bounds as in the case of the Yield fields, select the parameter in the Selected Parameter Value or Conditions columns, etc.

The user interface in FIG. 8, can be utilized with the measurements and functions. However, the functions can be run from command line interfaces or the like. Further, the user interface described with respect to FIG. 8 can be changes by using different field and section names and by adding and subtracting fields and sections.

Templates

In a command environment, it is often desirable to allow end-users to use and implement measurements without requiring the user to learn the complexities of programming the measurements or to learn the underlying details of a measurement implementation for a particular result set that has been achieved. In particular, it is useful to provide a method of allowing a user/system to identify what is being simulated and plotted along with associated changes. The user can then refine the display and store the changes. Regardless of intervening simulations, the user should be able to re-display the prior plot along with any changes.

An embodiment of the invention allows implementation of templates that are associated with graphs and tables based upon the data being displayed. These templates can be created using a display tool, which allows the users to customize the way their results are displayed using a GUI even though they may use a text user interface ("TUI") to create the display. Once it is possible to associate a view or show command with a window that is displaying its results, then it also becomes possible to update the results in a variety of ways. One could simply re-issue the view or show command and have the currently displayed results updated, or the new results can be overlaid, or a new window can be created for the new results. Therefore, automatic updating of existing graphs can be performed based upon the data and identifying options for automatically updating the template.

One embodiment of the invention provides a predefined collection of graph and table templates that are useful in particular situations. These view types can be collected and configured to normally allow one to get close to displaying the data in a way that is appropriate for the data being displayed.

Figure 12:
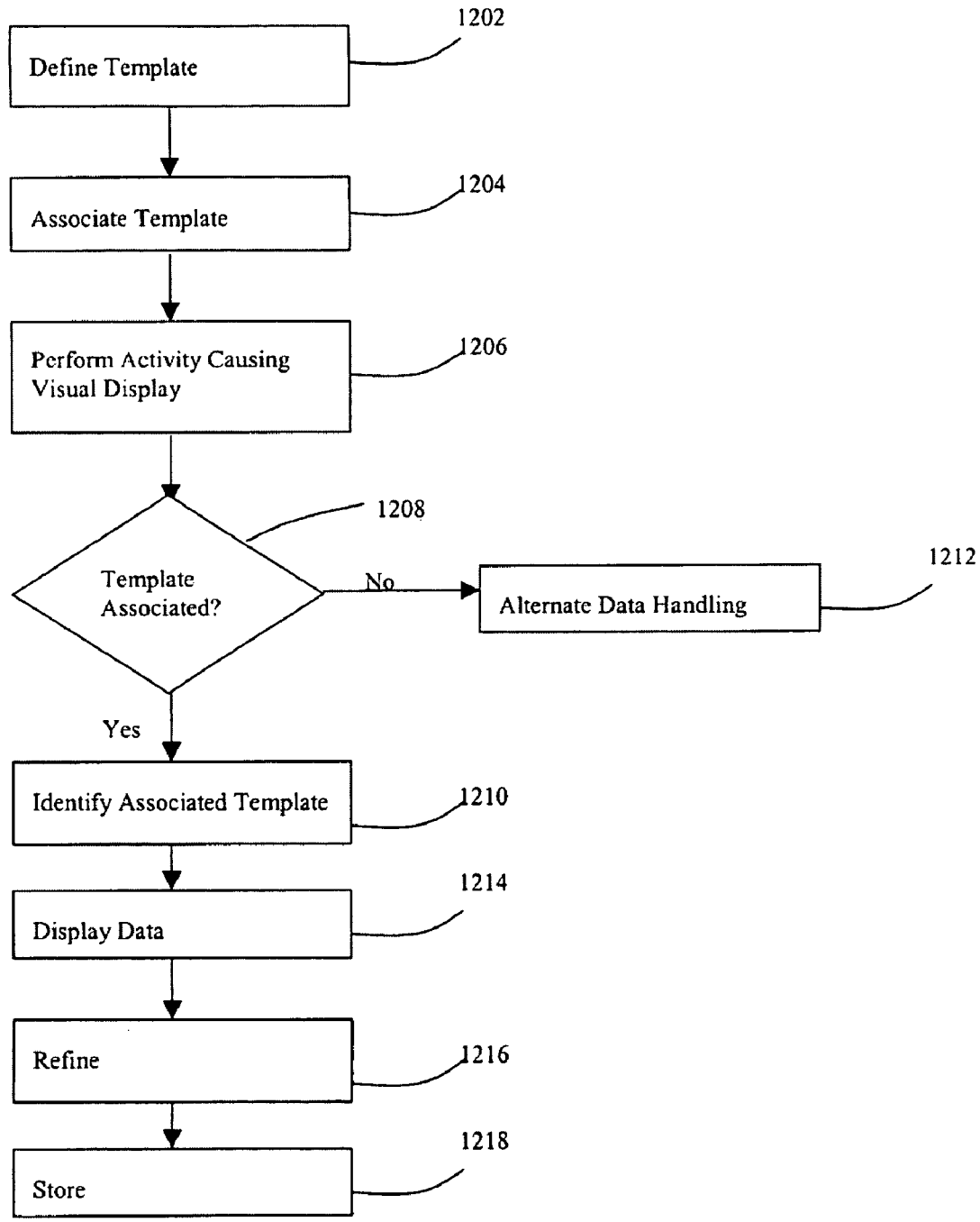
FIG. 12 shows a flowchart of a process for defining and using a template according to an embodiment of the invention.

FIG. 12 shows a flowchart of a process for using templates according to an embodiment of the invention. At 1202, one or more graph or table templates are defined for the system. The template collection could comprise a set of default templates for the system. In addition, the template might have resulted from a prior iteration of the process, in which the user has interactively refined a previously defined graph or table and then store the changes to a view template file. This file can be keyed to the plot or table by the names of the traces being displayed (1204). The next time that the same traces are displayed, the template is activated and the plot or table is recreated with the updated settings.

At 1206, an activity occurs that causes the type of display activity for using a view template. This type of activity may be, for example, a view or plot command issued by the user. A determination is made whether or which template is associated with the display activity at issue (1208). If not, then default display handling activities are performed (1212).

Otherwise, the specific template associated with the display activity or data is identified (1210). For a template to be automatically activated in one embodiment, the location, number, and name of traces plotted should match those used when the plot or table template was generated. In one approach, to avoid using a template that would otherwise be used automatically, the user or system would specify either the type or template argument with the plot command. The type argument indicates that a predefined template should be used. The template argument indicates that a previously generated template file that is not an exact match should be used. In this case, the traces specified on the view command are matched up with those present when the template was created by the order in which they are given. The view tool is used to create these templates, and it also has the ability to promote them to view types.

At 1214, the identified template is used to display the data. Once displayed, the user can interactively refine the graph or table and then store the changes in to a view template file (1216 and 1218).

Conditions and Corners

The present invention can be configured to provide the notions of the base circuit and of conditions. The base circuit is the circuit at the point when it was opened. Conditions represent changes made to the base circuit. This section presents an approach for implementing conditions and corners according to one embodiment of the invention.

Figure 14:
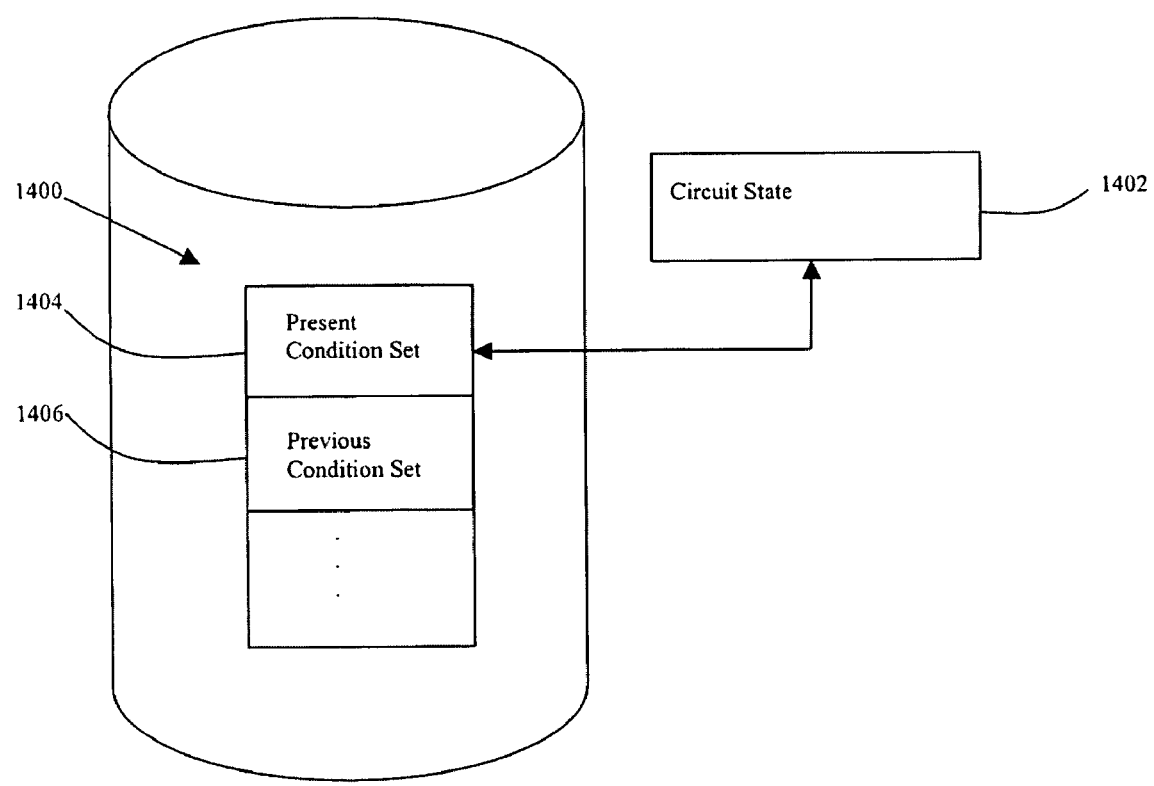
FIG. 14 shows an architecture for storing conditions according to an embodiment of the invention.

FIG. 14 shows an architecture for managing conditions according to one embodiment of the invention. In this approach, conditions are managed by dynamically keeping track of the condition set for a circuit or condition sets for previous results. For a circuit 1402, a data structure 1400 tracks the condition set for that circuit 1402. In the example of FIG. 14, the data structure not only maintains and tracks the current condition set 1404 for the circuit, but also tracks the prior chain of condition sets 1406 for that circuit. Thus, a history of changes can be tracked for a particular circuit. In one embodiment, the conditions can be stored with the simulation results. This is in sharp contrast to conventional approaches in which only results are stored.

Tracking conditions sets for a circuit provides numerous advantages. For example, this type of approach allows one to quickly revert a circuit to a previous conditions set, i.e., if a non-optimal change or set of changes has been made to a circuit. Moreover, storing condition sets allows the multiple condition sets to be compared. With respect to a netlist, tracking condition sets allow one to interactively update and modify a netlist with a particular combination of conditions.

In one approach, a condition set can be explicitly defined. For example, a manual or automated process can be performed to create a new condition set for a circuit. This allows one to capture a condition or set of conditions so that they are quickly applied to a circuit. Moreover, this allows a designer to capture the conditions that one would want to compare a circuit or result set against. This also allows a designer to define a corner set and run measurements over a corner (corners are explained in more detail below).

In one embodiment, one can only change values, not topology. Thus, topological changes would call for the circuit to be edited (by editing either the schematic or the netlist) and then be reopened. Each result has a set of conditions that can be displayed, compared, or reverted to. One can also apply conditions during the course of a measurement. Changes can be made to the circuit by directly assigning values to design parameter.

In an embodiment, a named sets of conditions can be created and applied as a group. Named sets of conditions are contained in groups, so to create a named set of conditions, or condition set, one should first create a group. In one approach, a comparison can be made for the current and original conditions against the conditions of a named set, a measurement, a dataset, or a file. One can also compare the conditions associated with two objects.

Condition sets are helpful if there are a fixed set of conditions under which the circuit is to be tested. For example, a condition set could include a temperature, one or more supply voltages, and one or more model groups.

It is possible to group condition sets into a set of 'corners'. A set of corners is a set of condition sets that completely overlap. In other words, a parameter that is set in one corner will be set in all. Condition sets that completely overlap can be considered equivalent. In on embodiment, only equivalent condition sets can be combined together into a corner set. Model groups are equivalent if they apply to the same components.

Condition sets can be attached to measurements, in which case they will be applied whenever that measurement is run for the duration of that measurement. Conditions can also be written to a file. A measurement is can be tagged to indicate the conditions should be taken from the measurement rather than the dataset of the same name. There are several ways of applying conditions when running measurements. The first is simply to apply the conditions to the circuit and run the measurement. These conditions will be the active set when subsequent measurements are run unless they have been overridden on a particular measurement. The second is simply to attach the conditions to the measurement. In this way, whenever the measurement is run with the conditions applied in addition to what ever changes were made to the base circuit. Finally, it is possible to apply conditions on a single run of a measurement.

These conditions are applied along with those attached to the measurement and to those already made to the base circuit, but they override those that apply to the same parameters. One can run the circuit over a set of condition sets using the run command.

The corners command is used to register a set of equivalent condition sets as a set of corners. As noted above, condition sets are equivalent if they each associate values to exactly the same set of design variables. In one embodiment, corners are applied in the same manner as named condition sets.

Once registered, the names of the corner are printed rather than the individual value of each design variable when the conditions are printed. If one of the value of a design variable that is a member of a corner is overridden, then in addition, its value would be printed along with the corner.

Therefore, shown is a method and system for defining condition sets and applying them to measurements. In addition, corner sets can be defined and measurements run over corners. As stated, the conditions can be stored with the results. Moreover, the system can revert to a previous condition. Multiple multiple condition sets can be compared as described above. The netlist can also be updated with conditions. In on embodiment, conditions are managed on the fly, by keeping track of current condition set for the circuit, or condition sets associated with previous results.

Probes

Consistent with embodiments of the invention, measurements can be written to be heavily reused. The idea is that there can be one version of a measurement in the library, and it can handle all common variations in the circuits to which it is expected to be applied. In one embodiment, it is the role of the specified parameters to allow the measurement to be customized to support this. The parameters allow the user to specify the analysis parameters (e.g., starting points, stopping points, etc.), stimulus parameters (e.g., source names, amplitude, frequency, etc.) and observation points (e.g., point of observation, observation variable and mode, etc.). Probes are functions/operations that can be flexibly used with measurements to handle desired variations in applying the measurement. The probe functions take nodes, terminals, or instances and allow any type of observation to be specified.

Figure 15:
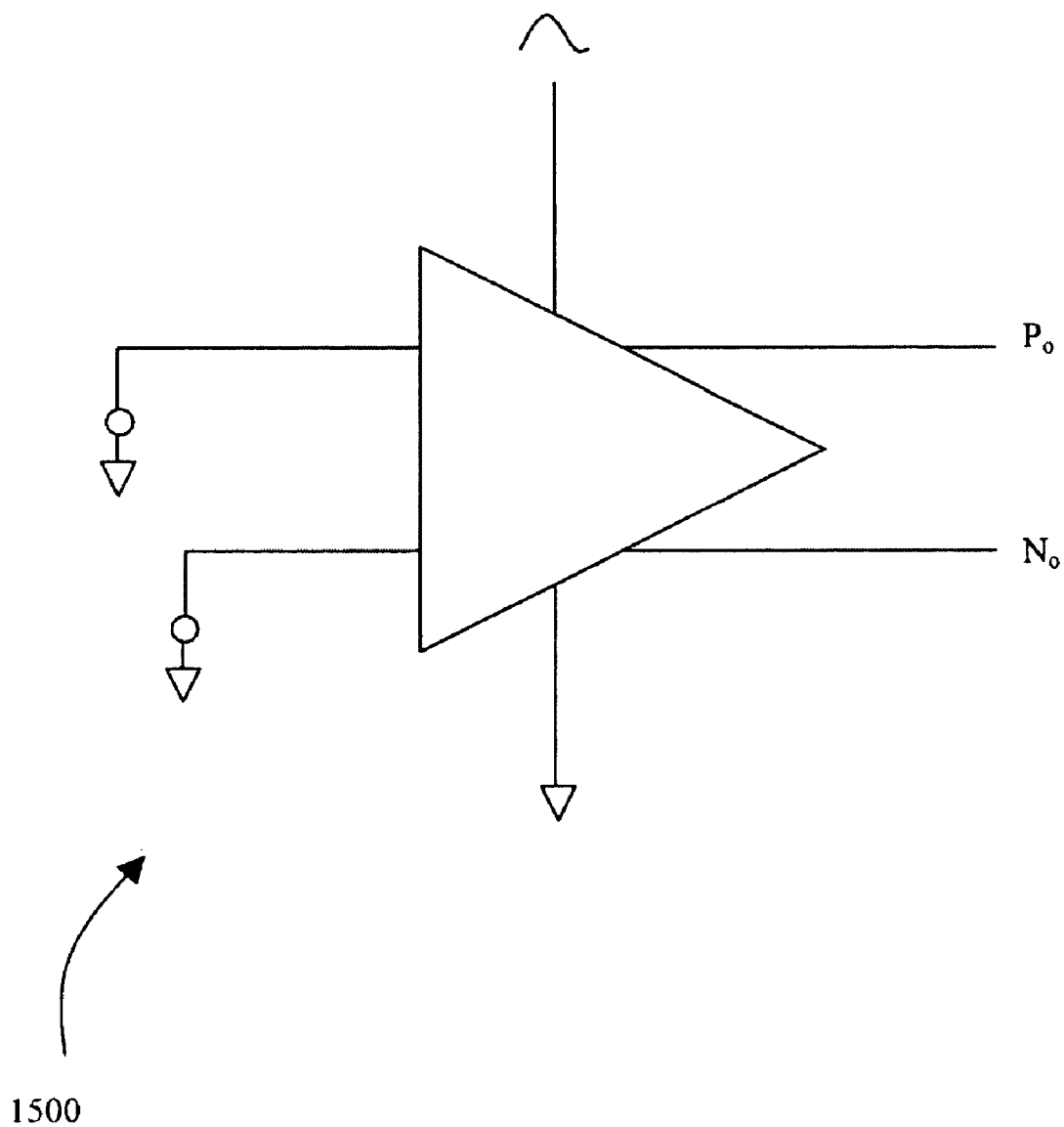
FIG. 15 shows an example circuit element.

To illustrate the use of probes in one embodiment, consider the device 1500 shown in FIG. 15. Assume that it is desired to analyze the electrical properties at $P_o$ and $N_o$. One approach is to perform "node passing" for a measurement for nodes $P_o$ and $N_o$, which can provide the voltage difference between these nodes. However, passing nodes is restrictive in that it cannot support other types of observations, e.g., current. To support other observations, e.g., both differential and common-mode, another parameter would have to be passed in.

In the present embodiment, a probe is employed as a parameter to a measurement. Because the probe function is defined external to the measurement, it can be flexibly defined to perform any desired functionality without requiring change to the measurement. In addition, the probe can be generically implemented and used in conjunction with any number of different observations. This allows any number or type of non-traditional signals, results, or observation data to be calculated, merely by implementing a probe directed to the desired operation/observation.

Therefore, for the example shown in FIG. 15, a probe can be defined to measure any desired property with respect to nodes $P_o$ and $N_o$, without requiring nodes to be passed in to the measurement. The probe function would take arguments that describe the observation point and convert it to a pointer which is passed into the measurement through a probe parameter. The probe parameter passes a pointer to a location in the circuit where some signal could be measured or input. The location of a probe can be associated with any object, e.g., a node, a terminal, a pair of nodes, a pair of terminals, a node and a terminal, or an instance. To be used with probe functions, an instance should be associated with either one or two terminals, or be in the definition of the instance itself, the default voltage and current should also defined.

Figure 13:
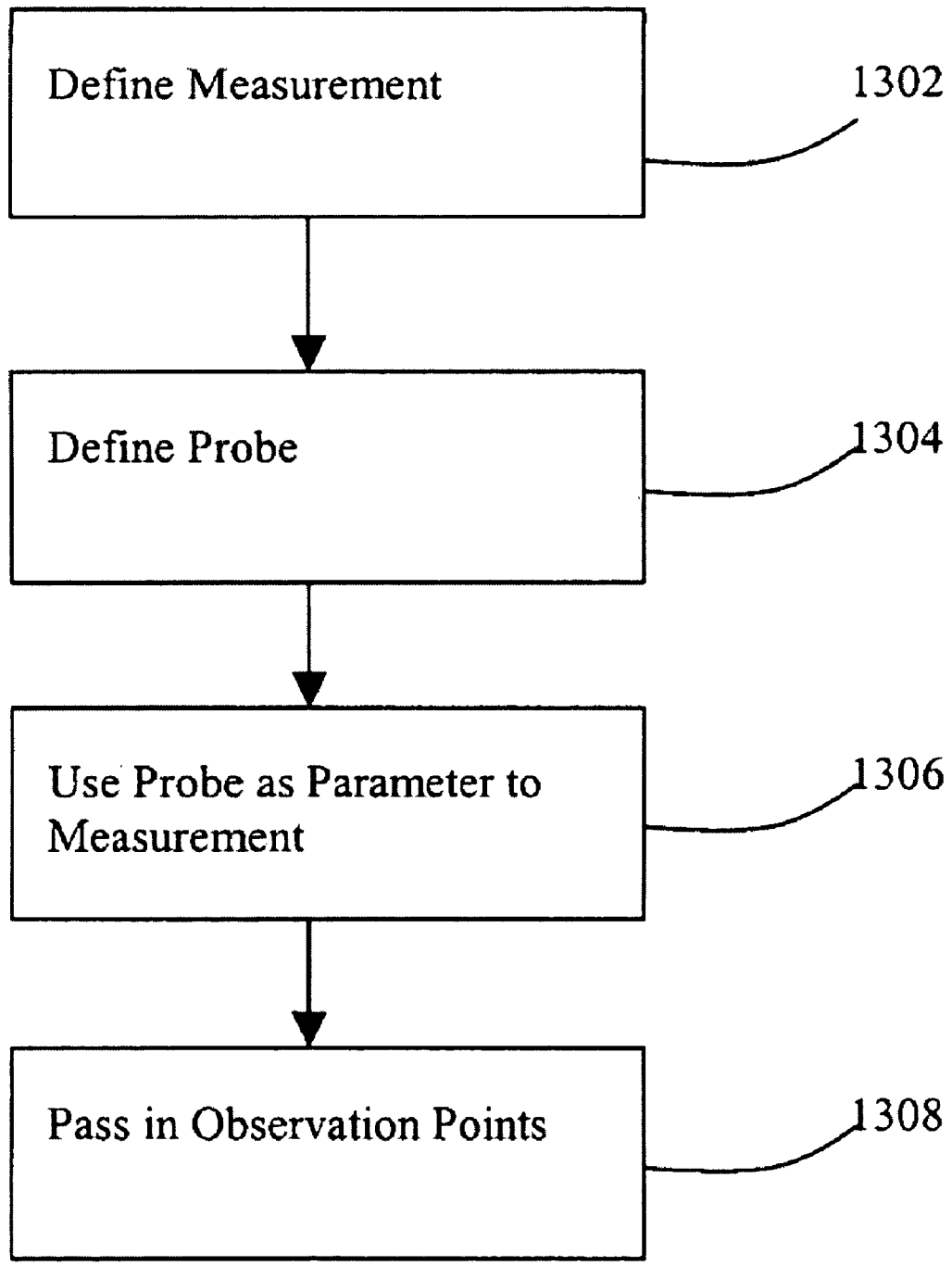
FIG. 13 shows a flowchart of a process for defining and using a probe according to an embodiment of the invention.

FIG. 13 shows a flowchart of a process for using probes according to an embodiment of the invention. At 1302, a measurement for a given set of functionality is defined. As part of that definition, a probe can be defined that is associated with that measurement (1304). Various illustrative approaches for defining probes are described in more detail below. The definition process allows a probe to be used as a parameter to a measurement (1306). It is the role of probes in this embodiment to allow the observation points to be passed into measurements as parameters in a way that is completely generic (1308). Without probes, one would normally have to pass nodes into the measurement in order to measure voltage, and terminals in to measure current. But this may constrain the measurement. By using probes, the measurement simply accepts a probe as a parameter. The possible variations in what can be observed are handled by probe functions.

Probe functions take nodes, terminals, or instances and perhaps a mode flag, and allow any type of observation to be specified. In particular, the observation point can be associated with a node, a terminal, a pair of nodes, a pair of terminals, a node and a terminal, or an instance. In one embodiment, to be used with probe functions, the instances may have either one or two terminals, or in the definition of the instance itself, the default voltage and current are defined. In another embodiment, an indication is provided (e.g., by the user) as to which signal is of interest or by defining a parameter to this effect. Probe literals can also be created using probe functions.

This section provides illustrative examples of probe functions showing syntax, operational, usage, and behavior for an embodiment of the invention. Examples of defined probe functions are val, which accesses the potential, and flow, which accesses the flow:

Examples

| | |
|---|---|
| val(p, n) | potential (voltage) between nodes p and n |
| val(Rload:1) | potential (voltage) from terminal Rload:1 to ground |
| flow(Rload:1) | flow (current) through terminal Rload:1 |
| val(Rload) | potential (voltage) across instance Rload |
| flow(Rload) | flow (current) through instance Rload |
| val(Q1:b, Q2:b) | potential (voltage) difference between terminals Q1:b and Q2:b |
| flow(Q1:b, Q2:b) | difference in flow (current) flowing into terminals Q1:b and Q2:b |

In addition, the circuit itself can provide additional probe functions that are suitable for use on particular signal types. In an embodiment, these functions are defined using Verilog natures. Electrical circuits will normally define V and I to be used to access the voltage and current. In addition, in mixed discipline applications, other natures will be used to define probe functions for other types of signals, such as mechanical, thermal, optical, hydraulic, etc.

Examples

| | |
|---|---|
| V(p, n) | voltage between nodes p and n |
| V(Rload:1) | voltage from terminal Rload:1 to ground |
| I(Rload:1) | current through terminal Rload:1 |
| V(Rload) | voltage across instance Rload |
| I(Rload) | current through instance Rload |

| | |
|---|---|
| V(Q1:b, Q2:b) | voltage difference between terminals Q1:b and Q2:b |
| I(Q1:b, Q2:b) | difference in current flowing into terminals Q1:b and Q2:b |

In an embodiment, applying a "flow" access function to a node or a pair of nodes is not allowed. In addition, if the probe is placed between two points, both points should have consistent natures (i.e., val(e,m) should not be used if e is electrical and m is mechanical). The arguments to the probe function can either be a variable that points to an object, or the object itself.

In one approach, probe functions take additional name argument to specify whether the desired signal is the differential signal or the common mode signal. If this argument is not given, then differential mode is assumed in one embodiment. If only one node or terminal is specified, then the signal is considered single-ended, in which case both differential and common modes return the same result. Otherwise, differential mode returns the difference and common mode returns the average.

Examples

| | |
|---|---|
| V(p, n, 'dm) | returns V(d) − V(n) |
| V(p, n, 'cm) | returns (V(d) + V(n))/2 |

The probe declarator is used to declare probes.

Example probe out=V(p,n)

The following measurement demonstrates one way in which probe functions are use within a measurement.

```
measurement cp --- "Measures 1 dB compression point" {
    input inst src=Pin from {port} --- "Input source"
    input inst load=Rout from {port, resistor} --- "Output load"
    input real start=−10_dBm --- "Initial input power level"
    input real stop=10_dBm from (start..) --- "Final input power level"
    input real fund=1GHz --- "Fundamental frequency"
    output point cp --- "Compression point"
    export signal Pout --- "Output power versus input power"
    src:type = 'sine
    src:freq = fund
    foreach src:dbm from swp(start=start, stop=stop) {
        run pss( fund=fund )
        real Vfund = V(load)[1]
        Pout=dBm(Vfund**2/(2*load:r) "W")
    }
    cp=compression_point(Pout,1)
}
```

This measurement computes the output power. Notice that the user defines the output of the circuit by passing in the load component, load. This gives at least two ways to compute the power. One could use either:

$pwr = V(\text{load}) * I(\text{load})/2$ or $pwr = V(\text{load})**2/\text{load}:r$ Here the probe allows access to the needed signals given only the name of the load instance. If one did not have the probe function, then two nodes are passed in to get the voltage and either a terminal to get the current or an instance to get the resistance. This could be more cumbersome. It may also be problematic because a user may specify the output inconsistently. The following example shows another use of probes where the probe is passed in as a parameter.

```
measurement setupTime --- "Measures setup time of a latch" {
    input inst clk from {vsource} --- "Clock source"
    input inst d from {vsource} --- "D input source"
    input probe q --- "Output signal"
    input real maxTs = clk:delay from (0..) --- "Maximum expected setup time"
    input real maxTsettle = maxTs from (0..) --- "Maximum expected settling time for the output signal"
    output real Ts --- "Setup time"
    clk:delay = maxTs
    search d:delay from binary(start=0, stop=maxTs, tol=10ps) {
        run tran(stop=maxTs + maxTsettle)
        Ts = latched(V(clk), V(d), q)
    } while (Ts != 'null)
}
```

When writing this measurement, one would not want to assume too much about the type of the output. The measurement should work for single and differential outputs as well as current outputs. And unlike the last example, a load component is not insisted upon. So instead, the user specifies the output using a probe. The output is passed in as the probe parameter q, which is treated like a signal within the measurement. The following example shows how a measurement might be illustratively called:

```
run setupTime( . . . , V(q), . . .)
    if the output is single-ended, as follows . . .
run setupTime( . . ., V(q,qbar), . . .)
    if differential, and as follows ...
run setupTime( . . ., I(FF1:q), . . .)
    if the output is a current.
```

At the time the measurement is called in an embodiment, there may not be a dataset, and consequently no signals q, qbar, or FF1:q may exist. So the probe function is defining a measurement point in the circuit, and it is associated with signals in a dataset when it is evaluated (in the latched functional within setupTime).

Signals

Signals are vectors of points, where a point is a pair: an ordinate and an abscissa. One uses signals to represent trajectories. This section discusses how to construct and access signals. Variable and parameter types provide support for optional abscissa values. The abscissa is an extra value for which there is a parametric relationship. When an abscissa is attached to a value, the value to which it is attached is referred to as the ordinate. For example, if x0 is assigned to be the value of a signal x at time t=0, then the abscissa t=0 would be attached to x0, the ordinate. Generally, abscissa are attached to signals during the process of a sweep. It may be an implicit sweep of time, as in a transient analysis, or an explicit sweep of some parameter using a foreach statement (section on page 33 and section on page 44). In addition, it is possible to add abscissa values to constants and variables that do not have them using the abscissa operator.

When applying operators to signals, the operators act on the ordinate, though they do so in the context of the abscissa. For example, if a and b are signals, then a+b causes the ordinates of a and b to be added together, but only at points that correspond (points in a and b that have the same value of the abscissa). For those points in a and b where there is no corresponding abscissa, interpolation is performed before the addition. Thus, if there is a point in a that does not have a corresponding point in b, then a corresponding point in b will be created by interpolation before performing the addition. The same process occurs for points in b for which there are no corresponding points in a. Sometimes it is useful to be able to strip off either the ordinate or the abscissa.

The abscissa operator (e.g., "@") is a binary operator that is used to both assemble a signal or a point from its operands and interpolate a signal at a particular abscissa value or values. In the case where it assembles two value into a point, or two vectors into a signal, the left operand becomes the ordinate and the right operand becomes the abscissa. It can be used with scalar, vector, or signal operands. If the left operand is a signal, interpolation is performed on the left operand so that the result conforms to the points in the right operand. In this case, the abscissa must be real and the range of the right operand must be contained within the range of the left. The binary @ operator can be used with the timer and cross functions to control the simulator and avoid interpolation.

Units can be associated with either the ordinate of the abscissa by proper placement of the units string. One can also construct a point literal that has units and names associated with both the ordinate and the abscissa.

Individual values in a vector are accessed by index. Individual values in signals can either be accessed by either by index or by abscissa. Each value in the signal is sequentially numbered starting from 0. This number is the index. In addition, each value is associated with a particular value of some independent parameter, such as time or frequency. This is the abscissa. Use brackets when accessing values in a signal by index. Use the abscissa operator "@" when accessing values in an signal by abscissa. Thus, if harmonics contains the harmonics of a signal with a 1 GHz fundamental, then harmonics[1] and harmonics@1 GHz both access the value of the first harmonic. To access a range of values, use val . . . val. Thus, harmonics[[0 . . . 5]] and harmonics@[0 . . . 5 GHz] extracts the values at DC and the first 5 harmonics (the brackets represent a closed interval rather than an array access). Use val . . . to specify a range that starts at a given value and continues up to the natural end of the range, . . . val to specify that range that starts at the natural beginning and continues up to a specified value, and . . . to specify the natural range. One can also use arrays as the index or abscissa to extract a subset of values. Thus, if odd={1,3,5} then harmonics[odd] extracts the odd harmonics. Similarly, odd={1 GHz, 3 GHz, 5 GHz} and harmonics@odd does the same thing.

A single index or abscissa applied to a multidimensional array pertains to the outer most independent variable. When more than one index operation (using either "[ ]" or "@") is applied together, each operation is associated with a dimension before the operation occurs. Thus, it is an error to apply more indexing operations than there are dimensions in the array. The indices and abscissas apply from the outside in and can be freely mixed. For example, if the measurement that generated the harmonics vector is swept over three temperatures, −25, 25, 75, then harmonics[2][1], harmonics[2]@1 GHz, harmonics@75[1], and harmonics@75@1 GHz, all represent the first harmonic at 75° C. To access the value of a first harmonic at all temperatures, use harmonics[[ . . . ]][1], harmonics[ . . . ]@[1], harmonics@[ . . . ][1], or harmonics@[ . . . ]@1 GHz.

Note that associating the index to the dimension prevents one from applying more than one indexing operation to the same dimension at one time. This is usually what is desired, however there are two ways to circumvent this and apply more than one indexing operation to the same dimension, either by using an intermediate variable or by using parenthesis to group the indexing operations.

Conclusion

Therefore, described are inventions for implementing simulation for a circuit. The present inventions overcome several problems that traditional simulation scripting languages suffer. The present invention may be embodied as any combination of software, hardware, or manual operations. In one specific embodiment, the invention is embodied as an electronic design automation ("EDA") command language for performing circuit simulation. Appendix A provides more details regarding an embodiment of an EDA command language for implementing the inventions.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering and contents of many of the described process actions may be changed without affecting the scope or operation of the invention. Also, while specific instruction syntax is used to exemplify the concepts and processes disclosed herein, e.g. cond for setting conditions, run for running a measurement or function, any other syntax that applies similar rules may be used without departing from the scope and spirit of the embodiments disclosed herein. The specification and drawings are, accordingly, to be regarded in an illustrative rather than restrictive sense.

What is claimed is:

1. A computer program product comprising a memory having an iterative looping construct that, when executed by at least one computer, causes the at least one computer to performs a process of implementing the iterative looping construct, the process comprises:

using the at least one computer that comprises at least one processor to perform a process, the process comprising:
beginning loop processing;
creating an independent processing environment of multiple independent processing environments for each of multiple iterates in the iterative looping construct;
implementing the iterative looping construct by performing independent parallel iterations of activities for the loop processing within each of the multiple independent processing environments for each of the multiple iterates to simulate or emulate one or more activities of an electronic circuit over a range of parameter values that is provided to a measurement for the electronic circuit during at least some of the independent parallel iterations in the loop processing, without using serial looping constructs, wherein
the measurement is associated with a dataset that is stored independently to maintain independence of measurements,
the activities comprise one or more tasks identified in the loop processing, and either an access to an index variable for the loop processing is removed, or the loop processing is performed without defining the index variable so the loop processing is performed without reference to the index variable during the loop processing;

resizing an N-dimensional array according to a total number of the multiple iterates in the iterative looping construct; and knitting the dataset generated within the iterative looping construct, into a hierarchical collection of datasets to retain a hierarchical characteristic of a sub-measurement in a measurement.

2. The computer program product of claim 1 in which the iterative looping construct captures all variables that are declared outside the loop and assigned within the loop.

3. The computer program product of claim 2 in which a scalar captured by the loop corresponds to an original value when the loop is entered, and wherein the scalar is reset to the original value on every iteration unless acted upon by an incremental assignment operator.

4. The computer program product of claim 3 in which the scalar corresponds to scalar variables from a simulation control language.

5. The computer program product of claim 3 in which the scalar corresponds to circuit parameters or simulator options.

6. The computer program product of claim 2 in which a scalar captured by the loop corresponds to an original value when the loop is entered, and wherein scalars captured by an incremental assignment operator are not returned to the original value upon exiting the loop.

7. The computer program product of claim 6 in which incremental assignment operators correspond to +=, −=, *=, or /=.

8. The computer program product of claim 6 in which a final value for the scalars captured by the incremental assignment operator is the results if all of the incremental operations were performed upon exit from the loop.

9. The computer program product of claim 2 in which a vector captured by the loop is resized to contain a same number of elements as the multiple iterates in the loop.

10. The computer program product of claim 9 in which each of the same number of elements of the captured vector corresponds to an iterate of the multiple iterates.

11. The computer program product of claim 9 in which an iterate cannot access any element in the vector except the one to which it corresponds.

12. The computer program product of claim 2 in which an array captured by the loop processing is visible as having one lower dimension within the loop processing than outside the loop processing.

13. The computer program product of claim 12 in which the one lower dimension within the loop processing is resized to have same number of elements as the multiple iterates in the loop processing.

14. The computer program product of claim 13 in which a one-dimensional vector captured by the loop processing is visible as a scalar inside the loop.

15. The computer program product of claim 1 in which the iterative looping construct iterates over corner sets.

16. The computer program product of claim 1 in which the iterative looping construct, on an iteration, attaches a value of a loop variable for an iterate to an element associated with the iterate for each vector captured by the loop processing, in which the loop variable is declared outside the loop processing and is assigned the value inside the loop processing.

17. The computer program product of claim 1 in which an iterate index and a total iteration count are attached to a loop variable as attributes.

18. The computer program product of claim 1 in which the iterative looping construct knits one or more datasets generated within the loop into a family of datasets, in which the one or more datasets generated within the loop processing are combined to add dimensions to at least one of the one or more datasets.

19. The computer program product of claim 1 in which the iterative looping construct runs each iterate in parallel without interference between the multiple of iterates.

20. The computer program product of claim 1 in which data values from parallel iterates are combined together.

21. The computer program product of claim 1 in which the iterative looping construct corresponds to a Foreach loop, wherein the Foreach loop is used to iteratively perform at least some of the activities for the loop processing.

22. The computer program product of claim 21 in which an output is an array of data over a range of a loop variable.

23. The computer program product of claim 21 in which the Foreach loop comprises a following form:

```
foreach iterate from list {
statement_list
}
``` in which, for each entry in the list, the iterate is set to an element value, one or more statements in the statement_list of the list are evaluated, and the foreach signifies the iterative looping construct and is used to iteratively perform at least some of the activities for the loop processing.

24. The computer program product of claim 21 in which the Foreach loop comprises a following form:

```
foreach list {
statement_list
}
``` wherein the foreach is used to iteratively perform at least some of the activities in the statement_list of the list for the loop processing, and the foreach signifies the iterative looping construct.

25. The computer program product of claim 21 in which the Foreach loop comprises a following format:

```
foreach condition_list {
statement_list
}
``` in which the condition_list is constrained to be a collection of one or more condition sets, and the foreach signifies the iterative looping construct and is used to iteratively perform at least some of the activities in the statement_list of the list for the loop processing.

26. The computer program product of claim 1 in which the iterative looping construct comprises a search loop.

27. The computer program product of claim 26 in which the search loop comprises a following form:

```
search iterate from list {
    statement_list
} until (condition)
``` wherein the search finds a first member of the iterate of the list that results in the condition being true and is used to iteratively perform at least some of the activities in the statement_list of the list for the loop processing.

28. The computer program product of claim 27 in which the first member is a target value of the iterate and the list is given as a vector of values, wherein the loop search begins at the first member of the list and continues towards an end of the list until the search loop finds the first member that results in the condition being true.

29. The computer program product of claim 26 in which the search loop comprises a following form:

```
search iterate from list {
    statement_list
} while (condition)
``` wherein a search is performed to find a last member of the iterate that results in the condition being true, and the search is used to iteratively perform at least some of the activities in the statement_list of the list for the loop processing.

30. The computer program product of claim 26 in which one or more members of the list are determined dynamically during a search based on a progress of the search.

31. The computer program product of claim 26 in which a binary search is performed.

32. The computer program product of claim 1 in which the iterative looping construct performs Monte Carlo analysis to analyze a random variable in the iterative looping construct.

33. The computer program product of claim 32 in which a number of trials in the Monte Carlo analysis is determined dynamically based at least in part on statistically evaluating results of the Monte Carlo analysis.

34. The computer program product of claim 33 in which the trials are determined dynamically, and the number of trials indicates a number of iterations in the Monte Carlo Analysis.

35. The computer program product of claim 1 further comprising re-dimensioning one or more arrays associated with the loop processing, in which the act of re-dimensioning adds a dimension to at least one of the one or more arrays by combining the at least one of the one or more arrays and another array of the one or more arrays.

36. The computer program product of claim 1 in which each of the independent parallel iterations is completely independent from other iterations.

37. The computer program product of claim 36 in which any particular iterate cannot access results computed by another iterate.

38. The computer program product of claim 1 in which the independent parallel iterations of the activities comprise simulation activities.

39. The computer program product of claim 1 in which the iterative looping construct is executed in a scripting language.

40. The computer program product of claim 1 further comprising restoring a scalar value for the loop processing to an initial value when the loop processing is entered on an iteration.

41. A computer implemented method for implementing an iterative looping construct, the computer implemented method comprising:
using the at least one computer that comprises at least one processor to perform a process, the process comprising:
beginning loop processing;
creating an independent processing environment of multiple processing environments for each of multiple iterates in the iterative looping construct;
implementing the iterative looping construct by performing independent parallel iterations of activities for the loop processing within each of the multiple independent processing environments for each of the multiple iterates to simulate or emulate one or more activities of an electronic circuit over a range of parameter values that is provided to a measurement for the electronic circuit during at least some of the independent parallel iterations in the loop processing without using serial looping constructs, wherein
the measurement is associated with a dataset that is stored independently to maintain independence of measurements,
the activities comprise one or more tasks identified in the loop processing, and
either an access to an index variable for the loop processing is removed, or the loop processing is performed without defining the index variable so the loop processing is performed without reference to the index variable during the loop processing;
resizing an N-dimensional array according to a total number of the multiple iterates in the iterative looping construct; and
knitting the dataset generated within the iterative looping construct, into a hierarchical collection of datasets to retain a hierarchical characteristic of a sub-measurement in a measurement.

42. A system for executing a list of tasks in parallel, the method comprising:
one or more processors that is to:
begin loop processing;
create an independent processing environment of multiple independent processing environments for each of multiple iterates in the iterative looping construct;
implement the iterative looping construct by performing independent parallel iterations of activities for the loop processing within each of the multiple independent processing environments for each of the multiple iterates to simulate or emulate one or more activities of an electronic circuit over a range of parameter values that is provided to a measurement for the electronic circuit during at least some of the independent parallel iterations in the loop processing by using the iterative looping construct without using serial looping constructs, in which
the measurement is associated with a dataset that is stored independently to maintain independence of measurements,
the activities comprise one or more tasks identified in the loop processing, and either an access to an index variable for the loop processing is removed, or the loop processing is performed without defining the index variable so the loop processing is performed without reference to the index variable during the loop processing, resize an N-dimensional array according to a total number of the multiple iterates in the iterative looping construct; and knit the dataset generated within the iterative looping construct, into a hierarchical collection of datasets to retain a hierarchical characteristic of a sub-measurement in a measurement.

43. The computer implemented method of claim 41, in which one or more scalars are returned to their respective initial value upon exiting the loop processing.

44. The computer implemented method of claim 41, in which one or more scalars captured by an incremental assignment operator are not returned to their respective initial value upon exiting the loop processing.

45. The system of claim 42, in which an array captured by the loop processing comprises one lower dimension within the loop processing than outside the loop processing.

46. The system of claim 42, in which the iterative looping construct comprises an independent parameterized measurement that is used to measure one or more performance characteristics of an electronic circuit.

* * * * *